United States Patent
Chen et al.

(10) Patent No.: US 12,040,513 B2
(45) Date of Patent: Jul. 16, 2024

(54) ENHANCING EFFICIENCIES OF OXY-COMBUSTION POWER CYCLES

(71) Applicant: Carbon Ventures, LLC, Beaumont, TX (US)

(72) Inventors: Daniel H. Chen, Beaumont, TX (US); Sy-Chyi Lin, Houston, TX (US)

(73) Assignee: Carbon Ventures, LLC, Beaumont, TX (US)

( * ) Notice: Subject to any disclaimer, the term of this patent is extended or adjusted under 35 U.S.C. 154(b) by 0 days.

(21) Appl. No.: 18/347,994

(22) Filed: Jul. 6, 2023

(65) Prior Publication Data
US 2024/0170692 A1    May 23, 2024

Related U.S. Application Data

(60) Provisional application No. 63/426,506, filed on Nov. 18, 2022.

(51) Int. Cl.
*H01M 8/04* (2016.01)
*F01N 5/02* (2006.01)
(Continued)

(52) U.S. Cl.
CPC ........ *H01M 8/04022* (2013.01); *F01N 5/025* (2013.01); *H01M 8/04156* (2013.01);
(Continued)

(58) Field of Classification Search
CPC ......... H01M 8/04022; H01M 8/04156; H01M 8/0656; H01M 8/1246
See application file for complete search history.

(56) References Cited

U.S. PATENT DOCUMENTS 7,654,320 B2    2/2010  Payton
8,241,801 B2    8/2012  Valensa et al.
(Continued)

FOREIGN PATENT DOCUMENTS

AT          404160 B       9/1998

OTHER PUBLICATIONS

Gokon et al., Cyclic properties of thermal storage/discharge for Al—Si alloy in vacuum for solar thermochemical fuel production, International Conference on Concentrating Solar Power and Chemical Energy Systems, SolarPACES 2014, Energy Procedia 69 (2015) 1759-1769, Japan.
(Continued)

*Primary Examiner* — Olatunji A Godo
(74) *Attorney, Agent, or Firm* — C. Tumey Law Group PLLC

(57) ABSTRACT

A variety of methods and systems are disclosed, including, in one embodiment, a method including introducing fuel and oxygen into a solid oxide fuel cell to generate electric current, a fuel cell oxygen effluent, and a fuel cell exhaust; combusting combustion fuel and an oxygen source in the presence of a working fluid to generate heat and a combustion exhaust, wherein the working fluid comprises carbon dioxide; heating the solid oxide fuel cell with the heat generated by combustion; generating additional electric current from the combustion exhaust with at least one turbine; separating the combustion exhaust to form a carbon dioxide enriched stream and a water enriched stream; and recycling at least a portion of the carbon dioxide enriched stream as the working fluid.

18 Claims, 7 Drawing Sheets

(51) Int. Cl.
    *H01M 8/04014*    (2016.01)
    *H01M 8/04119*    (2016.01)
    *H01M 8/0656*    (2016.01)
    *H01M 8/1246*    (2016.01)
    *H10N 10/13*    (2023.01)
    *H01M 8/12*    (2016.01)

(52) U.S. Cl.
    CPC ....... *H01M 8/0656* (2013.01); *H01M 8/1246* (2013.01); *H10N 10/13* (2023.02); *H01M 2008/1293* (2013.01)

(56) References Cited

U.S. PATENT DOCUMENTS

| | | | |
|---|---|---|---|
| 8,596,075 | B2 | 12/2013 | Allam et al. |
| 8,959,887 | B2 | 2/2015 | Allam et al. |
| 9,105,894 | B2 | 8/2015 | Perry et al. |
| 9,341,084 | B2 | 5/2016 | Xie et al. |
| 9,523,312 | B2 | 12/2016 | Allam et al. |
| 9,618,261 | B2 | 4/2017 | Huntington et al. |
| 9,702,300 | B2 | 7/2017 | Nemitallah et al. |
| 9,718,261 | B2 | 8/2017 | Landru et al. |
| 9,903,271 | B2 | 2/2018 | Oelfke et al. |
| 9,947,955 | B2 | 4/2018 | Sridhar et al. |
| 10,107,192 | B2 | 10/2018 | Nemitallah et al. |
| 10,184,396 | B2 | 1/2019 | Nemitallah et al. |
| 10,280,877 | B2 | 5/2019 | Hamad et al. |
| 10,422,252 | B2 | 9/2019 | Allam et al. |
| 10,797,327 | B2 | 10/2020 | Perry et al. |
| 10,840,535 | B2 | 11/2020 | Richards et al. |
| 11,111,847 | B2 | 9/2021 | Dunn |
| 11,370,725 | B2 | 6/2022 | Chen et al. |
| 2005/0079395 | A1* | 4/2005 | Varatharajan ...... H01M 8/04111 429/495 |
| 2011/0250119 | A1 | 10/2011 | Mello et al. |
| 2014/0329161 | A1* | 11/2014 | Laurencin ......... H01M 8/04052 204/267 |
| 2017/0271701 | A1* | 9/2017 | Berlowitz ......... H01M 8/04805 |
| 2021/0376413 | A1* | 12/2021 | Asfha .................... C25B 1/04 |

OTHER PUBLICATIONS

Allam et al., Demonstration of the Allam Cycle: An Update on the Development Status of a High Efficiency Supercritical Carbon Dioxide Power Process Employing Full Carbon Capture, Energy Procedia 114 (2017) 5948-5966, Jul. 2017.
http://kryothermtec.com/thermoelectric-generators-operating-on-gas-fuel.html accessed Jul. 6, 2023.
Jaziri et al., A comprehensive review of thermoelectric generators: technologies and common applications, Energy Reports 6 (2020) 264-287.
Fernandes et al., DMC controller design for an integrated Allam cycle and air separation plant, Computers and Chemical Engineering 141 (2020) 107019.
Fernandes et al., Process and Carbon Footprint Analyses of the Allam Cycle Power Plant Integrated with an Air Separation Unit, Clean Technologies, Oct. 15, 2019.
Veskovic et al., "Decarbonize LNG liquefaction with pre-combustion CO2 capture technology" Gas Processing & LNG 2022, 21-24.
US Department of Energy, Quadrennial Technology Review 2015, Chapter 4: Advancing Clean Electric Power Technologies, Technology Assessments, 2015.
Bryant et al., An Analysis and Comparison of the Simple and Recompression Supercritical CO2 Cycles, Supercritical CO2 Power Cycle Symposium, May 45-25, 2011, Boulder, Colorado.
Junior Isles, Gearing up for a new supercritical CO2 power cycle system, Gas Turbine World, Nov.-Dec. 2014, pp. 14-18.
McClung et al., High Inlet Temperature Combustor for Direct Fired Supercritical Oxy-Combustion, 2015 University Turbine Systems Research Workshop, Nov. 3, 2015.
Scaccabarozzi et al., Thermodynamic analysis and numberical optimization of the NET Power oxy-combustion cycle, Italy, 2016.
Wang et al., "New Conceptual Design of an Integrated Allam-Cycle Power Complex Coupling Air Separation Unit and Ammonia Plant," Ind. Eng. Chem. Res. 2021, Dec. 3, 2021, https://doi.org/10.1021/acs.iecr.1c02478.
http://www.graz-cycle.tugraz.at/ accessed Jul. 7, 2023.
Hoeger et al., "Cryogenic Carbon Capture Technoeconomic Analysis" International Conference of Greenhouse Gas Control Techniques 2021.
Wimmer et al., Optimization and comparison of the two promising oxy-combustion cycles NET Power cycle and Graz Cycle, International Journal of Greenhouse Gas Control 99 (2020) 103055.
Heitmeir et al., "The Graz Cycle—a Zero Emission Power Plant of Highest Efficiency"; XXXV Kraftwerkstechnisches Kolloquium; Sep. 23-24, 2003; Dresden, Germany (Graz University of Technology); 10 pages. cited by other.
Bolland et al., "A Thermodynamic Comparison of the Oxy-Fuel Power Cycles: Watercycle, Graz-Cycle and Matiant-Cycle"; Proceedings of the International Conference on Power Generation and Sustainable Development; Oct. 8-9, 2001; Liege, Belgium; 6 pages.
Sanz et al., "A Further Step Towards a Graz Cycle Power Plant for CO2 Capture"; Proceedings of GT 2005, ASME Turbo Expo 2005: Power for Land, Sea and Air; Jun. 6-9, 2005; Reno-Tahoe, Nevada, USA; pp. 1-10.
Sanz et al., 2018, "Adapting the Zero-Emission Graz Cycle for Hydrogen Combustion and Investigation of its Part Load Behavior", International Journal of Hydrogen Energy 43 (2018), 5737-5746 (DOI).
Li et al., A highly-robust solid oxide fuel cell (SOFC): simultaneous greenhouse gas treatment and clean energy generation, Energy Environ. Sci., 2016, 9, 3682.
Gür, (2016). Comprehensive review of methane conversion in solid oxide fuel cells: prospects for efficient electricity generation from natural gas. Prog. Ener. Combus. Sci. 54, 1-64. doi: 10.1016/j.pecs.2015.10.004.
Bashira et al., "High-temperature phase change materials for short-term thermal energy storage in the solar receiver: Selection and analysis," Journal of Energy Storage 30 (2020) 101496.
Mishra et al., Latent Heat Storage Through Phase Change Materials. Resonance, 20(6), 532-541, 2015.
Carreiro, et al., "Pressurized Testing of Solid Oxide Fuel Cell," 16th Annual Solid Oxide Fuel Cell (SOFC) Workshop, Jul. 16, 2015, https://netl.doe.gov/sites/default/files/event-proceedings/2015/2015sofc/Carreiro.pdf.
Willich et al., "Pressurized Solid Oxide Fuel Cells: Operational Behavior,"https://elib.dlr.de/71377/2/Pressurized_Solid_Oxide_Fuel_Cells.pdf.
Isfahani et al., (Jun. 15, 2016). "A hybrid micro gas turbine and solid state fuel cell power plant with hydrogen production and CO2 capture". International Journal of Hydrogen Energy. 41 (22): 9490-9499. doi:10.1016/j.ijhydene.2016.04.065.
Oryshchyn et al., "Fuel Utilization Effects on System Efficiency in Solid Oxide Fuel Cell Gas Turbine Hybrid Systems," Applied Energy (2018), 228, 1953-1965.
Sánchez et al., Performance analysis of a MCFC & supercritical carbon dioxide hybrid cycle under part load operation, International Journal of Hydrogen Energy 36 (2011) 10327-10336.
Ryu et al., Thermo-economic assessment of molten carbonate fuel cell hybrid system combined between individual sCO2 power cycle and district heating, Applied Thermal Engineering 169 (2020) 114911.
Baronci et al., Numerical investigation of a MCFC (Molten Carbonate Fuel Cell) system hybridized with a supercritical CO2 Brayton cycle and compared with a bottoming Organic Rankine Cycle, Energy 93 (2015) 1063-1073.
Enescu,"Thermoelectric Energy Harvesting: Basic Principles and Applications," Jan. 21, 2019, DOI: 10.5772/ intechopen.83495, https://www.intechopen.com/chapters/65239.
Araiz et al., Prospects of waste-heat recovery from a real industry using thermoelectric generators: Economic and power output analysis. Energy Convers. Manag. 2020, 205, 112376.

(56) References Cited

OTHER PUBLICATIONS

Loupis et al., Fuel consumption reduction in marine power systems through thermoelectric energy recovery. In Proceedings of the 2nd International MarineLive Conference on All Electric Ship, Athens, Greece, Jun. 3-5, 2013; pp. 1-7.

https://www.onelectrontech.com/teg-thermoelectric-generator-to-harvest-wasted-heat-from-vehicle-exhaust-pipes-and-radiator/ accessed Jul. 7, 2023.

Chen et al., "Enhanced Efficiency of Thermoelectric Generator by Optimizing Mechanical and Electrical Structures," Energies 2017, 10(9), 1329; Https://Doi.Org/10.3390/En10091329.

Liu et al., "Coupling thermoelectricity and electrocatalysis for hydrogen production via PbTe—PbS/TiO2 heterojunction", Journal of Power Sources 452-459, 342 (2017).

Selig et al., "Economical Route to Produce High Seebeck Coefficient Calcium Cobaltate for Bulk Thermoelectric Applications", Journal of the American Ceramic Society, pp. 3245-3248, 94(10) (2011).

Kikuchi et al., "Optimization of Spark-Plasma-Sintering Conditions for Maximizing Figure of Merit of La-Doped SrTiO3", Ceramic Transactions: Ceramic Materials for Energy Applications: Ceramic Engineering and Science Proceedings, 151-157 (32), Sep. 2011.

Nomura et al., "Microencapsulation of Metal-based Phase Change Material for High-temperature Thermal Energy Storage", Scientific Reports | 5 : 9117 | DOI: 10.1038/srep09117, Mar. 2015.

Sheng et al., "Development of a microencapsulated Al—Si phase change material with high-temperature thermal stability and durability over 3,000 cycles." Journals of Materials Chemistry A. Royal Society of Chemistry, 2018.

\* cited by examiner

ENHANCING EFFICIENCIES OF OXY-COMBUSTION POWER CYCLES

CROSS-REFERENCE TO RELATED APPLICATIONS

This application claims priority to U.S. Provisional Patent Application No. 63,426,506, filed on Nov. 18, 2022, entitled "Methods and Systems for Enhancing Efficiencies of Oxy-Combustion Power Cycles," the entire disclosure of which is incorporated herein by reference.

BACKGROUND

Carbon recapture has become a topic of interest among engineers, scientists, and policymakers for its potentially advantageous effect on the environment. Much of the nearly 40 billion metric tons of carbon dioxide released to the atmosphere each year may be attributed in some form or another to combustion of fuel. Historically, combustion methods have typically relied on air as the oxygen source needed for combustion. Due to the fact that air comprises mainly nitrogen, which is inert and does not take part in combustion, much of the heat generated by combustion is lost as waste heat. Alternative combustion methods tend to be both expensive and inefficient.

SUMMARY

Examples of the present disclosure are directed to a method. The method includes introducing fuel and oxygen into a solid oxide fuel cell to generate electric current, a fuel cell oxygen effluent, and a fuel cell exhaust. The method further includes combusting combustion fuel and an oxygen source in the presence of a working fluid to generate heat and a combustion exhaust, wherein the working fluid comprises carbon dioxide. The method further includes heating the solid oxide fuel cell with the heat generated by combustion. The method further includes generating additional electric current from the combustion exhaust with at least one turbine. The method further includes separating the combustion exhaust to form a carbon dioxide enriched stream and a water enriched stream. The method further includes recycling at least a portion of the carbon dioxide enriched stream as the working fluid.

Examples of the present disclosure are directed to a system. The system includes a solid oxide fuel cell. The system further includes a combustor in fluidic and thermal communication with a solid oxide fuel cell. The system further includes a turbine in energetic communication with the combustor. The system further includes a separator in fluidic communication with the combustor.

Examples of the present disclosure are directed to a system. The system includes a solid oxide fuel cell. The system further includes a combustor fluidically coupled to the solid oxide fuel cell. The system further includes a turbine directly coupled to the combustor and in thermal communication with the solid oxide fuel cell. The system further includes a recuperator energetically coupled to a turbine exhaust of the turbine. The system further includes a separator fluidically coupled to the recuperator, wherein the separator is operable to separate carbon dioxide and water. The system further includes a first thermoelectric generator in thermal communication with the separated carbon dioxide. The system further includes a second thermoelectric generator in thermal communication with the solid oxide fuel cell. The system further includes one or more phase change material in thermal communication with an exhaust.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

These drawings illustrate certain aspects of some of the examples of the present invention and should not be used to limit or define the invention.

DETAILED DESCRIPTION

Figure 1:
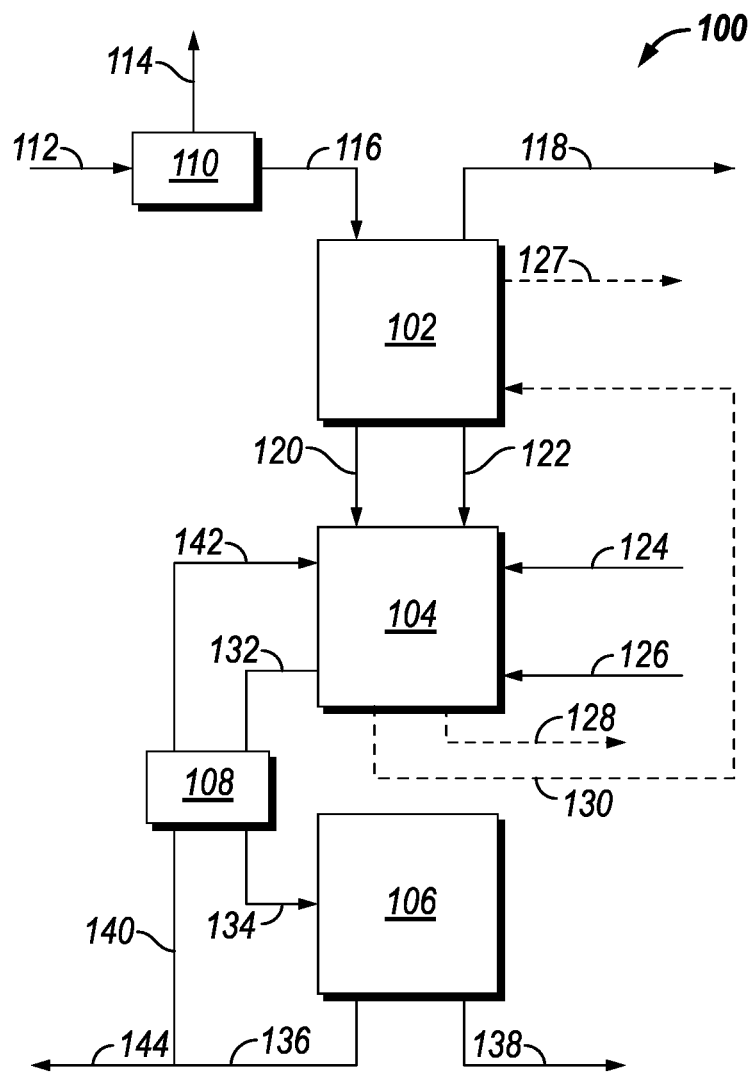
FIG. 1 illustrates an example direct-fired Brayton cycle power generation system with a solid oxide fuel cell integrated therein.

It is to be understood that the present disclosure is not limited to particular systems or methods, which may, of course, vary. It is also to be understood that the terminology used herein is for the purpose of describing particular examples only, and is not intended to be limiting. All numbers and ranges disclosed herein may vary by some amount. Whenever a numerical range with a lower limit and an upper limit is disclosed, any number and any included range falling within the range are specifically disclosed. Although individual examples are discussed herein, the invention covers all combinations of all those examples. As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected. If there is any conflict in the usages of a word or term in this specification and one or more patent or other documents that may be incorporated herein by reference, the definitions that are consistent with this specification should be adopted for the purposes of understanding this invention.

Disclosed herein are systems and methods relating to power generation and, more particularly, disclosed are power generation systems relying on oxy-fuel combustion. Even more particularly, certain examples of the present disclosure are directed to integrating one or more components into various oxy-fuel combustion processes, including a solid oxide fuel cell (SOFC), thermoelectric generators (TEGs), and phase change materials (PCMs).

Herein, phrases including "fluidical coupling," "in fluid communication," etc., indicate, whether directly or indirectly, one or more inlets, outlets, conduits, pipes, fittings, compressors, pumps, heat exchanger, the like, or any requisite means disposed between two or more system components necessary to ensure fluid passage therebetween. If a statement is made that a first system component, for example "A", is fluidically coupled to a second system component, such as "B", the statement does not preclude a third system component, such as "C" from also being fluidically disposed between A and B, or that a fluid may pass from A to B via C, such as by or through C.

Likewise, phrases including "energetic coupling," "in energetic communication," etc., such as "in thermal communication," herein indicate one or more mechanical components, heat exchangers, pistons, turbines, electrically conductive material, thermally conductive materials, the like, or any requisite means disposed between two or more system components necessary to ensure transfer of energy therebetween including, without limitation, thermal energy, mechanical energy, work, internal energy, kinetic energy, potential energy, chemical potential energy, etc.

Power cycles suitable for use in accordance with the teachings of the present disclosure may include, without limitation, direct-fired Brayton cycles. Other power cycles suitable for use in accordance with the teachings of the present disclosure may include, for example, S-Graz cycles, Allam-Fetvedt cycles ("Allam cycle"), Rankine cycles, oxy-fuel cycles, and any combinations thereof.

Advantages of the present disclosure may include, without limitation, a reduction in the amount of waste heat generated during power generation, higher overall power plant efficiency, a reduction in the size of process equipment required per kilowattage of generated power, a reduction in the necessary combustor volume per kilowattage of generated power, and a reduction in the necessary operational pressure of one or more process units per kilowattage of generated power.

Particularly, integration of SOFCs, TEGs, and PCMs into various power generation cycles results in an increase in their overall efficiencies. For example, integration of these elements may increase the overall efficiency of a power generation cycle from 52% to 55% or higher. In one synthetic example, it is anticipated that the overall efficiency of a power generation cycle in accordance with the present disclosure may be increased to about 58%.

FIG. 1 shows a power generations system 100 in accordance with one or more examples of the present disclosure. As illustrated, system 100 generally includes a fuel cell 102, a combustor/turbine 104, separators 106 and 110, and a recuperator 108.

In the illustrated example, air 112 is passed to separator 110. In separator 110, air 112 is separated into oxygen stream 116 and nitrogen stream 114. Separation in separator 110 may be achieved using any suitable method, for example, cryogenic distillation. Oxygen may be present in oxygen stream 116 in an amount from about 75 wt. % to about 100 wt. %. Alternatively, from about 55 wt. % to about 65 wt. %, about 65 wt. % to about 75 wt. %, about 75 wt. % to about 85 wt. %, about 85 wt. % to about 95 wt. %, about 95 wt. % to about 97 wt. %, about 97 wt. % to about 99 wt. %, about 99 wt. % to about 100 wt. %, or any ranges therebetween.

In the illustrated example, oxygen stream 116 is passed to a fuel cell 102. Fuel cell 102 may comprise a solid oxide fuel cell (SOFC), to be described in more detail. Alternatively, fuel cell 102 may comprise a polymer electrolyte membrane fuel cell (PEMFC), a direct methanol fuel cell (DMFC), an alkaline fuel cell (AFC), a phosphoric acid fuel cell (PAFC), a molten carbonate fuel cell (MCFC), a proton-conducting solid oxide fuel cell (PC-SOFC), a reversible fuel cell, a hybrid of the foregoing, an in-series, in-parallel, or in-series-parallel plurality of one or more of the foregoing, or any derivative or combination thereof.

As illustrated, oxygen stream 116 and fuel 118 are introduced to fuel cell 102. Oxygen stream 116 may be heated or unheated. In one or more examples, oxygen stream 116 is preheated to a temperature from about 500° C. to about 850° C. Heating may occur prior to introduction of fuel 118 to fuel cell 102. Alternatively, at the time of introduction, or at a location disposed within fuel cell 102 after introduction to fuel cell 102. Heating may be accomplished by any suitable means including, for example, a heat exchangers, a heater, a natural gas heaters, an electric heaters, or any combination thereof. Oxygen stream 116 may have a pressure from about 3 bar to about 300 bar. Alternatively, from about 3 bar to about 8 bar, about 8 bar to about 30 bar, about 30 bar to about 300 bar, or any ranges therebetween.

As illustrated, fuel 118 is passed to fuel cell 102. Fuel 118 may comprise natural gas, coal, hydrogen, propane, methane, butane, pentane, coal gas, liquefied petroleum gas, light fuel oil, heavy fuel oil, solid fuel, gaseous fuel, carbonaceous fuel, kerosene, gasoline, diesel fuel, naphtha, biodiesel, ethanol, charcoal, lignite, petroleum coke, natural gas, compressed natural gas, liquified natural gas, blast furnace gas, coke oven gas, water gas, methanol, nitromethane, jet fuel, JET-A, JP-8, biofuel, syngas, biogas, green hydrogen, pink hydrogen, blue hydrogen, derivatives, or any combination thereof. Fuel 118 may be heated or unheated. Fuel 118 may be preheated to a temperature from about 250° C. to about 500° C. Heavier fuels (e.g., propane) having relatively higher combustion temperatures may be preheated to higher temperatures, such as from about 250° C. to about 850° C. Fuel 118 may also be pressurized to a pressure from about 3 bar to about 300 bar. Pressurization may be accomplished by any suitable means including, for example, a compressor, a pump, or an engine.

Oxidation of fuel 118 is allowed to occur within fuel cell 102 by oxygen from oxygen stream 116 to produce a fuel cell exhaust 122 and a fuel cell oxygen effluent 120. In examples, fuel cell exhaust 122 comprises carbon dioxide, carbon monoxide, water, and unreacted fuel. Carbon dioxide may be present in fuel cell exhaust 122 in an amount of from about 45 wt. % to about 75 wt. %, or any ranges therebetween. Alternatively, from about 51 wt. % to about 65 wt. %. In some examples, for example, where methane is present in fuel 118 in an amount from 70 wt. % to 100 wt. %, carbon dioxide may be present in fuel cell exhaust 122 in an amount from about 51 wt. % to about 53 wt. %. In other examples, for example, where propane is present in fuel cell exhaust 122 in an amount from 70 wt. % to 100 wt. %, carbon dioxide may be present in fuel cell exhaust 122 in an amount from about 59 wt. % to about 65 wt. %. Oxygen may be present in fuel cell oxygen effluent 120 in an amount from about 0 wt. % to about 24 wt. %, or any ranges therebetween.

As illustrated, after oxidization of fuel 118 with oxygen 116, fuel cell exhaust 122 is passed to combustor/turbine 104. Combustor/turbine 104 may comprise a combustor energetically and/or fluidically coupled to a turbine. Combustor/turbine 104 may comprise one or more combustion chambers. As illustrated, fuel cell exhaust 122, oxygen effluent 120, additional fuel stream 124, and additional oxygen stream 126 are passed to combustor/turbine 104 for combustion. Combustion may be oxy-fuel combustion, having a higher concentration of oxygen present relative to the amount of oxygen present in air. For example, oxygen may be present in any of oxygen stream 116, fuel cell oxygen effluent 120, and/or additional oxygen stream 126 in an amount from about 21 vol. % to about 99 vol. %. Alternatively, from about 21 vol. % to about 30 vol. %, about 30 vol. % to about 40 vol. %, about 40 vol. % to about 50 vol. %, about 50 vol. % to about 60 vol. %, about 60 vol. % to about 70 vol. %, about 70 vol. % to about 80 vol. %, about 80 vol. % to about 85 vol. %, about 85 vol. % to about 90 vol. %, about 90 vol. % to about 92.5 vol. %, about 92.5 vol % to about 95 vol. %, about 95 vol. % to about 97 vol. %, about 97 vol. % to about 98 vol. %, about 98 vol. % to about 99 vol. %, about 99 vol. % to about 99.5 vol. %, about 99.5 vol. % to about 99.9 vol. %, or any ranges therebetween.

As illustrated, working fluid 142 may also be introduced into combustor/turbine 104. Working fluid 142 may serve to regulate the flame temperature during combustion. Working fluid 142 may comprise carbon dioxide and/or water. The operating temperature of a combustor in combustor/turbine 104 may be maintained from about 650° C. to about 1400° C. Alternatively, from about 650° C. to about 700° C., about 700° C. to about 750° C., about 750° C. to about 800° C., about 800° C. to about 850° C., about 850° C. to about 900° C., about 900° C. to about 950° C., about 950° C. to about 1000° C., about 1000° C. to about 1100° C., about 1100° C. to about 1200° C., about 1200° C. to about 1300° C., about 1300° C. to about 1400° C., or any ranges therebetween. The operating pressure may be from about 30 bar to about 500 bar. Alternatively, from about 30 bar to about 50 bar, about 50 bar to about 100 bar, about 100 bar to about 200 bar, about 200 bar to about 250 bar, about 250 bar to about 300 bar, about 300 bar to about 350 bar, about 350 bar to about 400 bar, about 400 bar to about 450 bar, about 450 bar to about 500 bar or any ranges therebetween.

Following combustion, exhaust 132 is formed. As mentioned, exhaust 132 may be passed directly through a turbine. Alternatively, heat from exhaust 132 may generate steam wherein the steam is passed through a turbine to generate power. Exhaust 132 may comprise carbon dioxide, carbon monoxide, water, any unreacted oxygen and/or unreacted fuel, and any inert gases initially present in fuel cell oxygen effluent 120 or additional fuel stream 126 (e.g., nitrogen, argon), and/or any other combustion products or oxidation products generated by combustor/turbine 104 and fuel cell 102.

In the illustrated example, exhaust 132 passes through recuperator 108. Recuperator 108 is a special purpose counterflow heat exchanger for recovering waste heat from exhaust gases. As shown, during use, exhaust 132 passes through recuperator 108 in one direction while working fluid 142 passes through recuperator 108 in the opposite direction. While a recuperator 108 is described as a special purpose counterflow heat exchanger, it should be understood that recuperator 108 may alternatively be substituted and/or supported by any means suitable for recovering heat from exhaust 132 including, for example, shell-and-tube heat exchangers, tube-in-tube heat exchangers, welded plate heat exchangers, regenerative heat exchangers, condensers, plate-fin heat exchangers, dynamic scraped surface heat exchangers, dimple plate/plate coil heat exchangers, and any combinations thereof. As illustrated, recuperator exhaust 134 is passed to separator 106 for separating carbon dioxide 136 from water 138. Separation of water 138 from carbon dioxide 136 may be accomplished by any suitable method including, to use a non-limiting example, flash distillation.

After separation, carbon dioxide 136 is passed to one or more pipelines or tanks and/or recycled as working fluid 142. For example, a first portion 144 of carbon dioxide 136 may comprise pipeline grade carbon dioxide to be transported away and/or stored for sequestration, subsurface geological storage, utilization, carbon capture, or any combination thereof. Pipeline grade carbon dioxide herein refers to a fluid wherein carbon dioxide is present in an amount of at least 96 wt. % by weight of the fluid, wherein $O_2$ is present in in an amount less than 50 ppm, and wherein $H_2O$ is present in an amount less than 20 ppm. A pipeline pressure of second portion 144 may be in an amount between 7.4 and 21 MPa. Alternatively, from about 7.4 to about 10 MPa, about 10 MPa to about 15 MPa, about 15 MPa to about 21 MPa, or any ranges therebetween. A pipeline temperature of first portion 144 may be between about 0° C. and about 35° C. Alternatively, about 0° C. to about 10° C., about 10° C. to about 20° C., about 20° C. to about 35° C., or any ranges therebetween. Above 7.4 MPa, $CO_2$ may exist as a supercritical fluid, a single dense phase existing over a wide range of temperatures.

As illustrated, stream 140 comprising a portion of carbon dioxide 136 is recycled as working fluid 142. Prior to reintroduction to a combustor in combustor/turbine 104 as working fluid 142, second portion is passed through recuperator 108. While FIG. 1 is described and illustrated such that working fluid 142 is carbon dioxide, working fluid 142 may alternatively or additionally include water, to be shown and described in later examples.

As illustrated, thermal communication 130 may transfer heat generated by combustion in combustor/turbine 104 to fuel cell 102. Thermal communication 130 may be achieved, for example, by passing exhaust 132 through an internal region of fuel cell 102, such as through one or more conduits disposed within fuel cell 102. One or more heat exchangers may alternatively be utilized to transfer heat from any heated portion of system 100 to fuel cell 102 or any stream entering fuel cell 102. To use non-limiting examples, heat may be derived from exhaust 132, a casing or conduit heated by exhaust 132, working fluid 132, combustor/turbine 104, or any other heated component or region thermally connected to a heated component of power generation system 100.

As mentioned, fuel 118 may comprise hydrogen. Hydrogen may be derived from any suitable source, including from one or more hydrolyzers. Hydrolyzers in accordance with the present disclosure may comprise an anode and a cathode for applying a direct current to water. A hydrolyzer may be powered by, for example, solar power, wind power, geothermal power, hydroelectric power, bioenergy, oceanic energy, nuclear energy, and any combination thereof. For example, one or more solar panels, solar farms, wind turbines, hydro turbines, nuclear power plants, or the like may be energetically coupled with a hydrolyzer to provide power needed for hydrolyzing of water to form hydrogen. In some examples, oxygen generated by a hydrolyzer may be used in oxygen stream 116 and/or additional oxygen stream 126.

Figure 2:
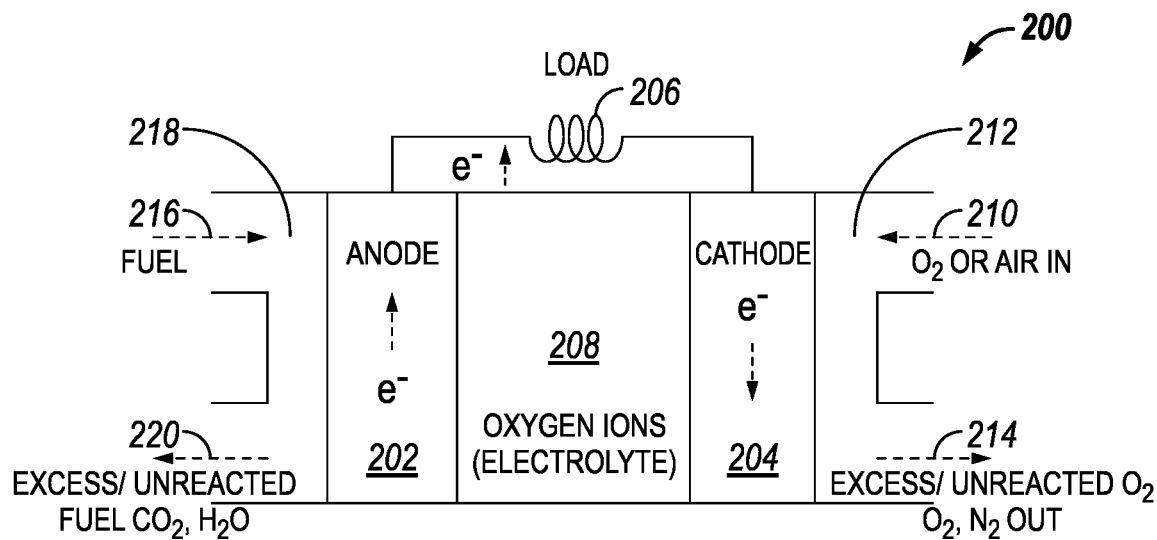
FIG. 2 illustrates a solid oxide fuel cell.

FIG. 2 is a solid oxide fuel cell 200 (SOFC) in accordance with one or more examples of the present disclosure. As shown, a SOFC 200 may generally comprise an anode 202, a cathode 204, an electrolyte layer 208, and a load 206 disposed between anode 202 and cathode 204.

Anode 202 may comprise a porous or semi-porous, metal or ceramic layer. Anode 202 may expose fuel 216 to oxygen ions generated by cathode 204 and conducted through electrolyte layer 208. Oxidation of fuel 216 by the oxygen ions is highly thermodynamically favorable and the porosity of anode 202 provides a large reactive surface area for oxidation. Materials suitable for inclusion with anode 202 may include, without limitation, a ceramic, a metal, or a combination thereof. In some examples, anode 202 may be characterized as having a power density from about 0.2 W/cm² to about 1 W/cm² at 0.7 V at 800° C. Alternatively, about 0.2 W/cm² to about 0.5 W/cm², about 0.5 W/cm² to about 0.7 W/cm², about 0.7 W/cm² to about 1 W/cm², or any ranges therebetween. In certain examples, anode 202 has a power density of about 0.6 W/cm² at 0.7 V at 800° C.

Cathode 204 is a thin, porous layer operable for reducing oxidizer 210 and forming and conducting oxygen ions. As shown, cathode 204 is disposed adjacent to electrolyte layer 208 opposite to anode 204. Cathode 204 may comprise, to use a non-limiting an example, lanthanum strontium manganite (LSM). In one or more examples, cathode 204 may be doped with zirconia electrolytes. Cathode 204 may alternatively comprise, for example, a composite material, such as a composite of LSM and YSZ, or a mixed ionic/electronic conducting (MIEC) ceramic, such as perovskite lanthanum strontium cobalt ferrite. As mentioned, cathode 204 is operable to reduce oxidizer 210. Oxidizer 210 comprises oxygen. Oxygen ions conducted across electrolyte layer 208 may include oxygen ions (e.g., O⁻ and O²⁻). Due to the large temperature difference between start-up and the SOFC 200 standard operating conditions, cathode 204 may comprise a material having a coefficient of thermal expansion similar to that of electrolyte layer 208 to prevent strain between contact surfaces of electrolyte layer 208 and cathode 204. For example, a coefficient of thermal expansion of cathode 204 may be within about a 1%, about 5%, about 10% margin, or any ranges therebetween relative to a coefficient of thermal expansion of electrolyte layer 208.

Electrolyte layer 208 is a dense layer of ceramic that conducts oxygen ions. To prevent leakage current, electronic conductivity of electrolyte layer 208 is minimized while still allowing for oxygen ion transport through electrolyte layer 208. As with cathode 204, performance of electrolyte layer 208 is optimized at high temperatures, such as at temperatures above 800° C. Electrolyte layer 208 may comprise a solid oxide material. Solid oxide materials may refer to a material suitable for use in SOFC 200 for transporting oxygen ions from cathode 204 to anode 202 and may include, to use non-limiting examples, yttria-stabilized zirconia (YSZ) (e.g., 8YSZ), scandia stabilized zirconia (ScSZ) (e.g., 9ScSZ), gadolinium doped ceria (GDC), or any combinations thereof. Electrolyte layer 208 may be coated with a thin ceria diffusion barrier to prevent undesirable reactions between electrolyte layer 208 and cathode 204 such as when cathode 204 comprises lanthanum strontium cobalt ferrite and electrolyte layer 208 comprises YSZ. Electrolyte layer 208 is operable to conduct negatively charged ions from cathode 204 to anode 202. One advantage of using a solid oxide material as an electrolyte is that doing so displaces a need for expensive catalyst materials, such as platinum, which is typically required for lower temperature fuel cells. In addition, solid oxide material has a decreased vulnerability to carbon monoxide catalyst poising.

In operation, oxidizer 210 may enter oxidizer flow path 212 and come into contact with cathode 204 to react and form oxygen ions. Ions formed by the exposure to cathode 204 may under certain conditions conduct through cathode 204, electrolyte layer 208, and anode 202 to react with fuel 216. Fuel 216 may enter fuel flow path 218 and come into contact with the ions conducted through anode 202 to react and form SOFC exhaust 220. Formation and conduction of ions through SOFC 200, as well as reaction of ions with fuel, are accelerated by the high-temperature (e.g., >800° C.) and high-pressure (e.g., >8 atm) environment of SOFC 200. SOFC exhaust 220 may comprise unreacted fuel as well as one or more redox reaction products, such as carbon dioxide and water, which may exit SOFC 200 from an outlet of fuel flow path 218 to be passed, for example, to combustor/turbine 104 (referring to FIG. 1) for combustion. Likewise, any unreacted oxidizer 214 may exit oxidizer flow path 210 and may be also passed, for example, to combustor/turbine 104 for combustion.

In one or more examples, fuel 216 may comprise hydrogen (H 2), carbon monoxide (CO), methane (CH 4) or any combination thereof. Reduction of oxygen into O₂ ions at cathode 204 may be shown by equation (1). Oxidation of fuel for each hydrogen, carbon monoxide, and methane at anode 202 are shown respectively by equations (2), (3), and (4).

$$0.5O_2 + 2e^- \rightarrow O^{2-} \qquad \text{eq (1)}$$

$$H_2 + O^{2-} \rightarrow H_2O + 2e^- \qquad \text{eq (2)}$$

$$CO + 0.5O^{2-} \rightarrow CO_2 + e^- \qquad \text{eq (3)}$$

$$CH_4 + 4O^{2-} \rightarrow 2H_2O + CO_2 + 8e^- \qquad \text{eq (4)}$$

One advantage of using pure oxygen as the oxidizer 210 is that a current generated by SOFC 200 has a current density 2.5 times that of a current generated by the same SOFC using air alone.

SOFCs such as Ni/YSZ/LSM (Lanthanum Strontium Manganite) and Ni—YSZY—ZrO₂/LSCM (Lanthanum Strontium Chromium Manganite) may be used in accordance with some examples to be used at suitably high temperatures, such as between 500° C. and 1000° C. and may have outputs between 100 W to 2 MW. At 800° C., some SOFC systems according to certain examples may provide an electrical efficiency of around 60% and a combined heat and power (CHP) efficiency using natural gas ($C_mH_n$) fuel may be as high as 85-90%. For example, hybrid power generation systems comprising an SOFC and a gas turbine using air and syngas may be used in accordance with certain examples. In other examples, a power generation system may comprise a tri-reactor chemical-looping (TRCL) system, an SOFC, and a micro gas turbine. In one or more examples, one or more molten carbonate fuel cells (MCFC) may be incorporated into an oxy-combustion power cycle to carbonate one or more salts therein. As used herein, "oxy-fuel combustion" is combustion of fuel in the presence of pure or semi-pure oxygen and, optionally, recycled flue gas. Oxy-fuel combustion may impose a 7-10% energy penalty on a power generation process as compared to air-fired processes due in large part to the energy cost of separating oxygen from nitrogen.

An optimum operating temperature of SOFC 200 may be from about 500° C. to about 1000° C. Alternatively, from about 500° C. to about 700° C., about 700° C. to about 850°

C., about 850° C. to about 1000° C., or any ranges therebetween. Similarly, an optimum operating pressure of a fuel cell may be from about 3 bar to about 8 bar, or even from about 30 bar to about 300 bar pending anticipated advancements in fuel cell and fuel cell stack technology. Alternatively, from about 3 bar to about 5 bar, about 5 bar to about 8 bar, about 8 bar to about 15 bar, about 15 bar to about 30 bar, about 30 bar to about 100 bar, about 100 bar to about 150 bar, about 150 bar to about 200 bar, about 200 bar to about 300 bar, or any ranges therebetween.

In some examples, SOFC 200 may have an efficiency from about 60% to about 90%. Alternatively, from about 60% to about 70%, about 70% to about 80%, about 80% to about 90%, or any ranges therebetween. An electric current generated by a fuel cell may comprise DC current.

In accordance with present examples, TEGs may be incorporated into a power generation system such as in the direct-fired Brayton cycle power generation system of FIG. 1 or with the SOFC of FIG. 2. As mentioned, industry-standard or even state-of-the-art power generation plants may undesirably be susceptible to heat loss to the environment. Such heat loss may result in less-than-ideal power generation cycle efficiencies. Contrarily, examples of the present disclosure may include TEGs to recapture heat generated by the power generation cycles so as to prevent heat loss and improve efficiency.

While certain examples are described or illustrated to demonstrate suitable placement of TEGs in and throughout the power generation systems disclosed, it should be understood that TEGs may be incorporated in any suitable manner or location in accordance with the present examples to reduce heat loss and/or maximize power generation cycle efficiency. Suitable locations may include, without limitation, an outer casing of a combustor or turbine, such as of a combustor or combustor/turbine of combustor/turbine 104 (referring to FIG. 1), recuperator 108 (referring to FIG. 1), a conduit carrying cooled combustion exhaust stream 134 (referring to FIG. 1), after a $CO_2$ compressor, on a body of an SOFC stack, such as a body of fuel cell 102 (referring to FIG. 1), or any combination thereof. Additional locations are shown and described in later examples.

Figure 3A:
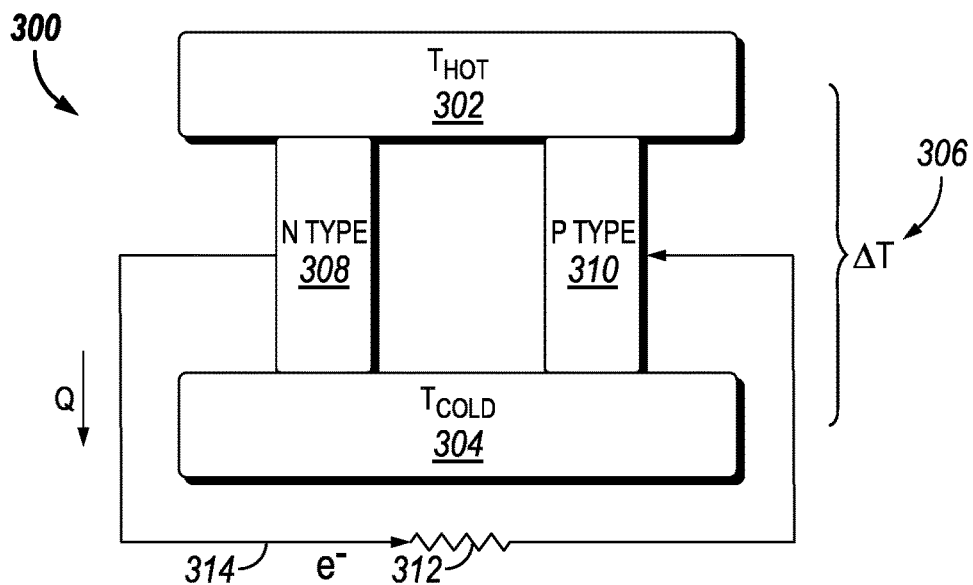
FIG. 3a illustrates a thermoelectric generator.

FIG. 3a illustrates a TEG 300 in accordance with certain examples of the present disclosure. As shown in FIG. 3a, a TEG may comprise a heat source 302 and a heat sink 304. Without being limited by theory, it is believed that TEGs convert energy of a heat duty (Q) to electrical energy by converting a heat flux to an electric current 314 across a load 312. This is achieved by passing the heat flux from the heat source 302 to the heat sink 304 through n-type semiconductors 308 and p-type semiconductors 310.

Accordingly, and as illustrated, one or more semiconductors 308 and 310 may be disposed between heat source 302 and heat sink 304. A heat source 302 may comprise a heated material having a high temperature. Heat source 302 and/or heat sink 304 may be thermally conductive. Semiconductors 308 and 310 may comprise an n-type and/or p-type material. N-type semiconductors 308 are characterized as having electrons in majority and holes in minority, whereas p-type semiconductors 310 are characterized as having holes in majority and electrons in minority. A temperature differential 306 creates electrical potential (voltage) between heat source 302 and heat sink 304 to generate an electric current between two electrodes. A load 312 may be disposed between two electrodes, and a current 314 may flow in, for example, an n-type to p-type direction.

Figure 3B:
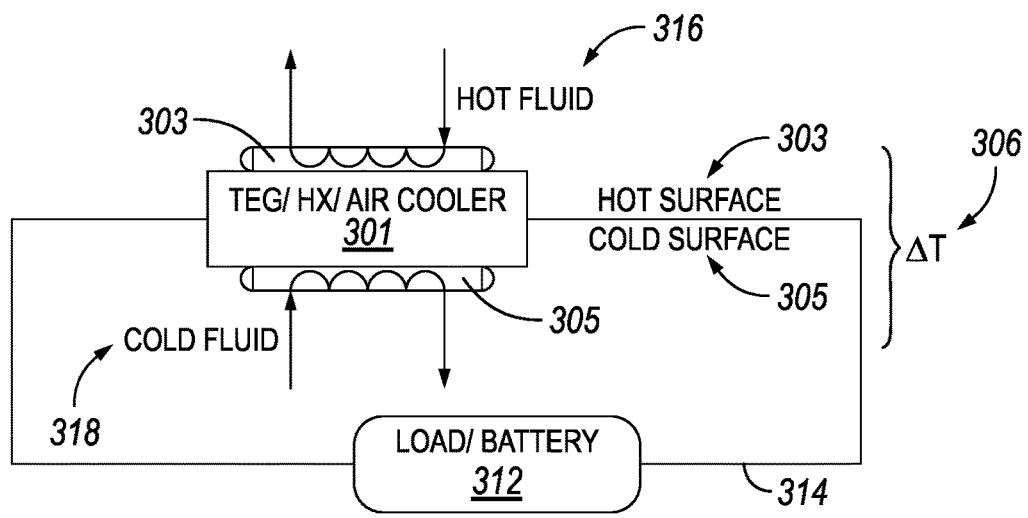
FIG. 3b illustrates a thermoelectric generator.

FIG. 3b illustrates a TEG 300 in accordance with certain examples of the present disclosure. As illustrated, heat source 302 may comprise a hot fluid 316, and heat sink 304 may comprise a cold fluid 318. Also, load 312 may comprise a battery. In some examples, a TEG module 301 may be disposed between a hot surface 303 and a cold surface 305.

In operation, hot fluid 316 may flow along hot surface 303 and impart heat thereto. Likewise, a cold fluid 318 may flow along cold surface 305 to accept heat therefrom. A temperature differential 306 between hot surface 303 and cold surface 305 may drive an electric current 314 across a load 312. TEG module 301 may comprise any suitable TEG device, including the TEG module 301 described later on in FIGS. 3d and 3e.

Figure 3C:
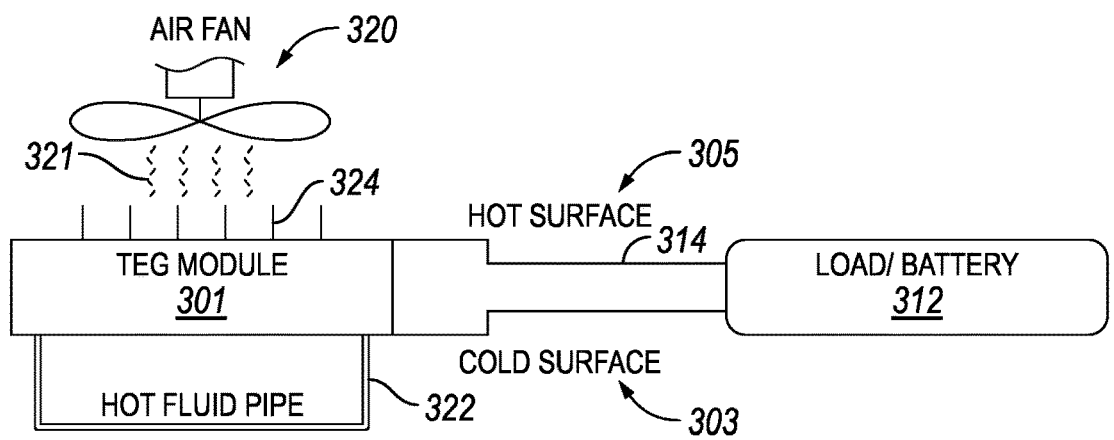
FIG. 3c illustrates a thermoelectric generator.

FIG. 3c illustrates a TEG 300 in accordance with certain examples of the present disclosure. As illustrated, heat source 302 may comprise a hot fluid pipe 322, and heat sink 304 may comprise a cold surface 305 exposed to an air fan 320 and air current 321. One or more fins 324 may be thermally coupled to cold surface 305 to facilitate heat transfer from cold surface 305 to air current 321. Alternatively, cold surface 305 may simply be modified such that an amount of surface area exposed exceeds the surface area of cold surface 305 without the modification.

In operation, a fluid in hot fluid pipe 322 may flow along an inner surface of hot fluid pipe 322 to impart heat thereto. Heat may be conducted through a wall of hot fluid pipe 322 and transferred to hot surface 303. From hot surface 303, heat may further travel through TEG module 301 to cold surface 305 to generate electric current 314 across load 312. Air from air current 321 may accept heat from cold surface 305, such as by removing the heat from one or more fins 324 thereof. It should be understood that while FIGS. 3a-d show three specific configurations for a TEG, that the principles taught herein may be applied in any suitable configuration without departing from the spirit or scope of this disclosure.

Figure 3D:
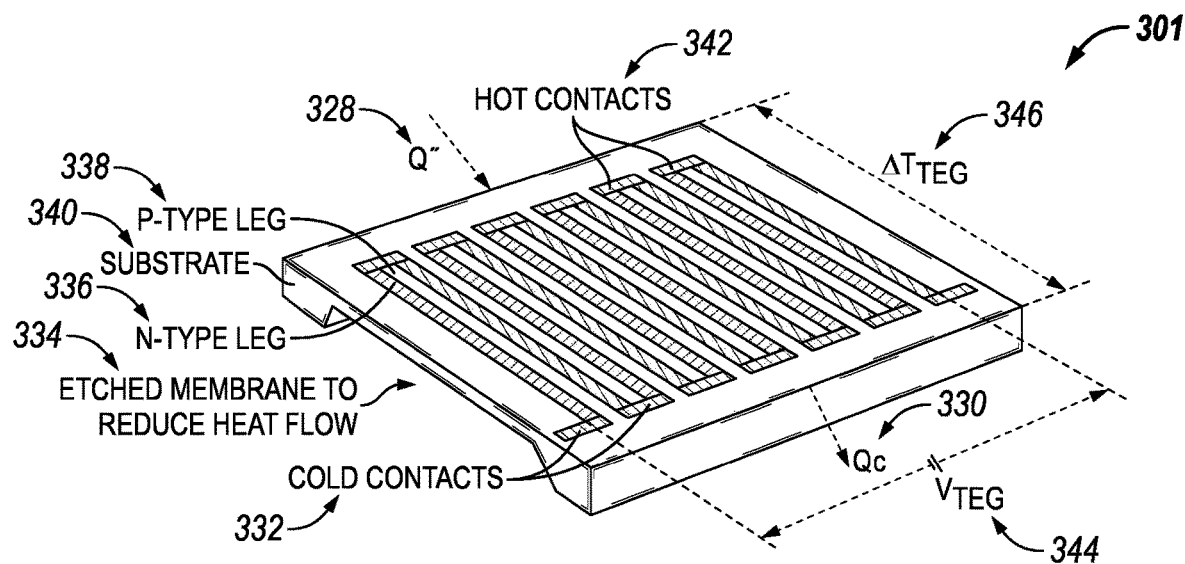
FIG. 3d illustrates a thermoelectric generator module.

FIG. 3d shows TEG module 301. As shown in FIG. 3d, TEG module 301 may be configured horizontally. As illustrated, TEG module 301 comprises one or more arrays of p-type semiconductors and one or more arrays of n-type semiconductors, represented in FIG. 3d as n-type log 336 and p-type log 338 respectively. TEG module 301 may also comprise substrate 340, hot contacts 342, and cold contacts 332. Substrate 340 may be etched to reduce heat flow. A temperature difference 346 may form between hot contacts 342 and cold contacts 332 to generate heat 330. A measurable voltage difference may also form between two laterally spaced regions of TEG module 301, ultimately resulting in current flow.

Figure 3E:
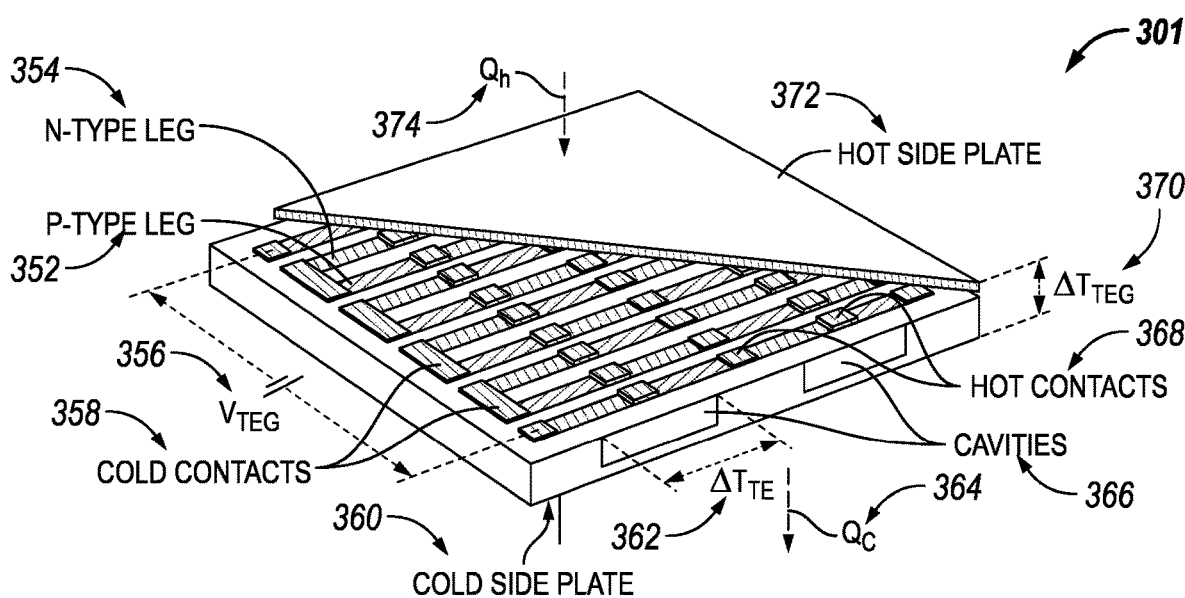
FIG. 3e illustrates a thermoelectric generator module.

FIG. 3e shows a TEG module 301. As shown in FIG. 3e, TEG module 301 may be configured vertically. Alternatively, TEG module 301 may be arranged in any suitable arrangement. For example, p- and n-type semiconductors may be arrayed perpendicularly or parallel to a temperature differential, or in any arrangement suitable for conversion of heat flux to electric current.

An electrically conductive material including but not limited to copper may be used in a TEG. Electrically conductive material may be adhered to opposite sides of semiconductors. An electric insulator material may also be used including, but not limited to, ceramic. A thermally conductive material may also be used and may be disposed between the heat source and an outer surface, or an interface material comprising a thermally conductive liquid, thermally conductive settable liquid or adhesive may be disposed between the thermally conductive material and the semiconductor to minimize contact resistance and maximize heat transfer.

Any suitable number of semiconductors, TEGs, and/or configurations/arrangements of semiconductors and/or TEGs may be used including, without limitation, TEGs stacked together to allow for a greater total heat duty between heat source and heat sink. For example, a single TEG may generate between about 0.5 kilowatts to about 100 kilowatts of power. Alternatively, from about 0.5 kilowatts to about 10 kilowatts, about 10 kilowatts to about 25 kilowatts, about 25 kilowatts to about 30 kilowatts, about 30 kilowatts to about 40 kilowatts, about 40 kilowatts to about 50 kilowatts, about 50 kilowatts to about 75 kilowatts, about 75 kilowatts to about 100 kilowatts, or any ranges therebetween.

TEGs may comprise any of $Bi_2Te_3$ metal, $Bi_2Se_3$ metal, $NaCo_2O_4$, $(Ca_2CoO_3)xCoO_2$ oxides, the like, and/or combinations thereof.

Typically, in power generation systems, the desired efficiency is not achieved until the system reaches ideal operating conditions, such as high temperature and/or high pressure. For example, Carnot efficiency of an engine is maximized when the disparity between hot and cold temperatures is maximized. greater, thus a hotter engine will have a higher efficiency than a cooler engine. Fuel economies of vehicles are roughly 12% lower in 20° F. temperatures than at 77° F. temperatures due to the inefficiencies and energy costs associated with ramp-up of engine temperatures. Ideal operating temperatures for a power plant of the types embodied in FIG. 1 are in the range of 500° C. to 950° C., preferably between 700° C. and 850° C. Examples of the present disclosure may address the industry need for rapid, easily accessible, and on-hand heat supply to components of a power plant undergoing ramp-up, start-up, or in an otherwise transient state.

PCMs are well suited for systems and methods of the present disclosure due to their inherent ability to store latent heat by undergoing highly enthalpic phase changes. PCMs may refer broadly to PCMs in general or more specifically to Micro-Encapsulated PCMs (MEPCMs).

Figure 4:
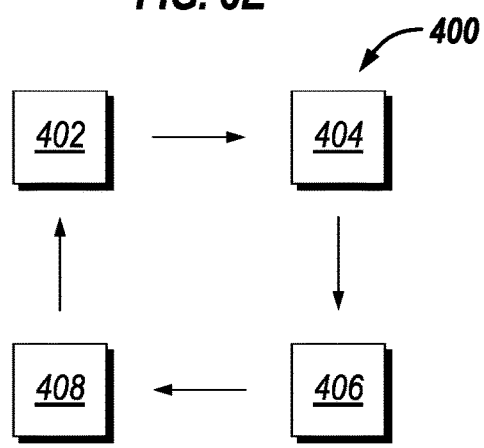
FIG. 4 illustrates a cycle for a phase change material undergoing a phase change.

FIG. 4 illustrates a PCM undergoing a phase change. The PCM may transition between a solid phase in block 402 and a liquid phase in block 406. Blocks 404 and 408 represent the PCM at its phase change temperature. As illustrated, a solid PCM in block 402 may be heated until it reaches a phase change temperature in block 404. During phase change in block 404, temperature of the PCM remains constant until the solid PCM from block 402 has melted to form a liquid in block 406. From block 406, the PCM may revert back to a solid phase in block 402 by cooling the PCM back to its phase change temperature in block 408.

PCMs may be suspended in a tank reservoir to deliver or store thermal energy in transient operations, such as during ramp-up or ramp-down of a power generation cycle or during startup of an SOFC. For example, during normal operation of a power plant (e.g., referring to FIG. 1), heat is generated. Excess heat may be stored and temporarily absorbed by one or more PCMs in thermal communication with conductive regions of system 100, such as to a casing of a combustor of combustor/turbine 104, conduits for transporting turbine exhaust, conduits connected to $CO_2$ condensers, conduits for transporting fuel cell exhaust 122, casing of a fuel cell 102, coolers, heat exchangers, recuperators 108, the like, turbine casing, interior regions of a combustor in combustor/turbine 104, fuel cell 102, or any turbine, pipe, fitting, fluid conduits disposed therebetween, or thermally conductive materials attached to any such region, or combination thereof. PCMs may be used in combination with one or more heat exchangers or otherwise thermally coupled to any suitable thermally conductive region of a power cycle or heated surface thereof. Later examples give further specific locations where PCMs may be applied.

During operation, latent heat stored in PCMs may accelerate the ramp-up of an SOFC. In one or more examples, at least a portion of the heat required to bring a fuel cell to an operating temperature from rest may be attributed to heat stored in a PCM, such as by an amount of at least 5%.

PCMs may also be used to maintain a stable operating temperature or pressure of a power plant component, or otherwise minimize fluctuations in operating conditions. For example, heat from one or more PCMs may be transferred to a fuel cell or combustor during operation or in response to dips and spikes in demand.

It is further contemplated that any material or substance capable of undergoing a phase change could be classified as a PCM, such as ice/water. For the purposes of this disclosure, however, PCMs refer specifically to those materials having very high phase change enthalpies, and in one or more examples, phase change temperatures within a range from about 500° C. to about 1500° C. Alternatively, from about 300° C. to about 500° C., about 500° C. to about 700° C., about 700° C. to about 750° C., about 750° C. to about 850° C., about 850° C. to about 1000° C., about 1000° C. to about 1250° C., about 1250° C. to about 1500° C., or any ranges therebetween. For example, $MgF_2$ may be suitable for some examples as it has a solid to liquid phase change enthalpy difference of approximately 939 kJ/kg at a phase change temperature of 1263° C. Another example may include Al—Si alloys. Some al-Si alloys may have a solid-to-liquid phase change enthalpy difference varying from about 376 kJ/kg to about 483 kJ/kg at a phase change temperature of about 577° C.

PCMs may therefore comprise materials including without limitation organic materials, inorganic materials, metals, alloys, ceramics, and eutectic materials, provided that they are characterized as having high phase change enthalpies at desired temperatures. Such organic materials may comprise paraffin and non-paraffins. Inorganic materials may comprise metallic alloys, salt hydrates, NaF, $MgF_2$, $CaF_2$, and the like. Eutectic materials may comprise one or more mixtures of two or more PCM components, such as organic and inorganic materials.

Figure 5:
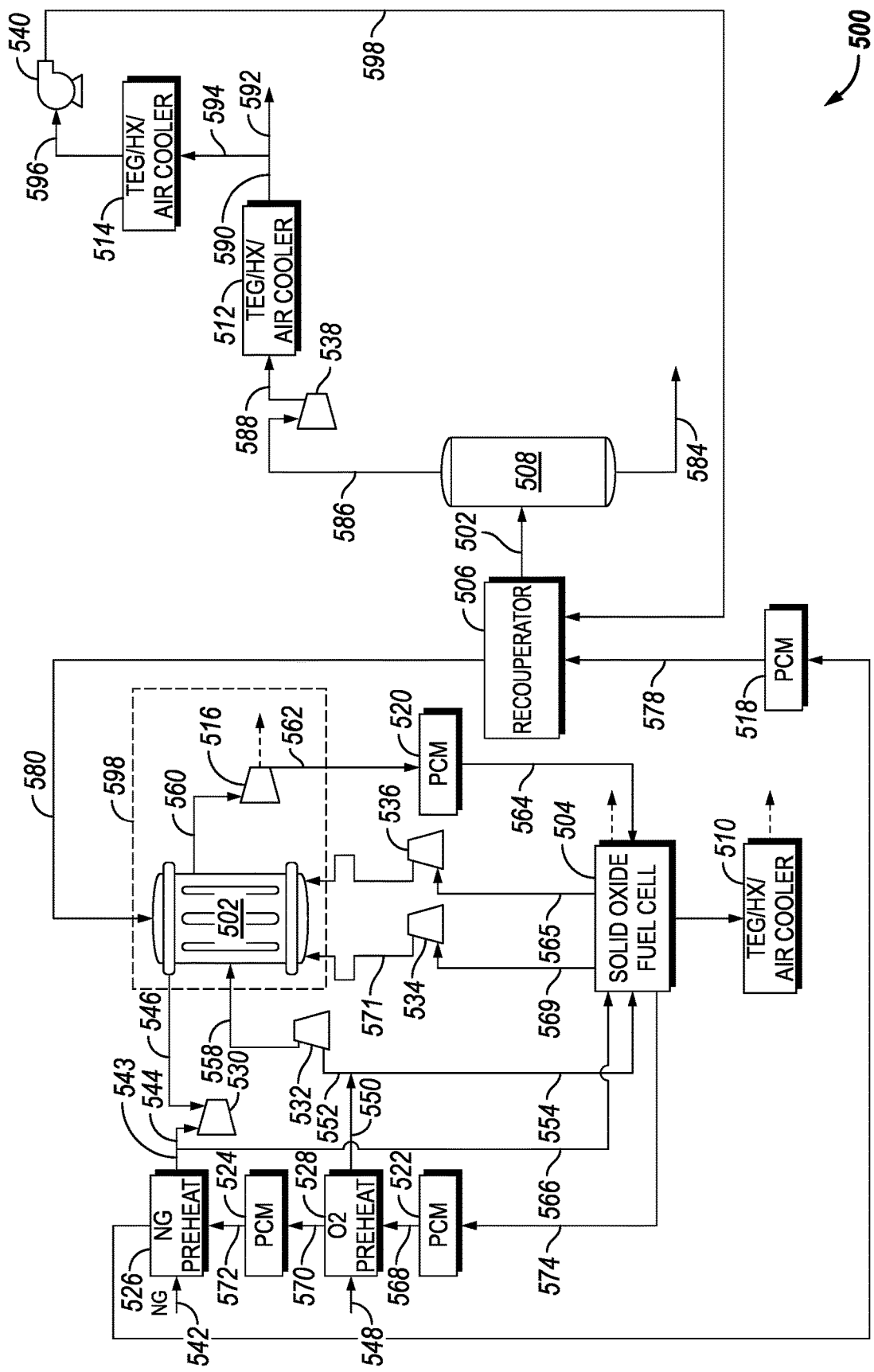
FIG. 5 illustrates an example direct-fired oxy-fuel Brayton cycle with a solid oxide fuel cell, thermoelectric generators, and phase change materials incorporated therein.

FIG. 5 illustrates a direct-fired oxy-fuel Brayton cycle with recycled $CO_2$ and a SOFC 504, unit 510, TEGs 512, and 514, and PCMs 518, 520, 522, and 524 incorporated therein. As illustrated, power generation system 500 may comprise a combustor 502, SOFC 504, and separator 508. SOFC 504 may alternatively comprise any of the fuel cells previously described in this disclosure. The power generation system 500 may additionally comprise a recuperator 506, unit 510, TEGs, 512, and 514, heat exchangers, air coolers 510, 512, and 514, PCMs 518, 520, 522, and 524, compressors 530, 532, 534, 536, and 538, turbine 516, and $CO_2$ pump 540. An oxygen source 548 and a fuel source 542 may be fluidically and/or energetically coupled to either or both SOFC 504 and a combustor 502. SOFC 504 may be in fluidic and/or energetic communication with combustor 502. Compressors 530, 532, 534, and 536 may be disposed between fuel source 542 and the combustor 502, between SOFC 502 and combustor 502, on a partially reacted fuel effluent stream from SOFC 504 to the combustor 502, and on a partially reacted oxidizer effluent stream from SOFC 504 to combustor 502 respectively. Combustor 502 may be fluidically and/or energetically coupled to a turbine 516. PCMs 518, 520, 522, and 524 are shown as being thermally coupled to various regions disposed throughout the system, such as between exhaust 574 and exhaust 578, between turbine exhaust 562 and turbine exhaust 564, between exhaust 566 and exhaust 568, between exhaust 570 and exhaust 572 respectively. Turbine 516 may be fluidically and/or energetically coupled to either or both the SOFC 504 and the combustor 502. SOFC 504 may further be fluidically and/or energetically coupled to one or more TEGs, heat exchangers, and/or air coolers, such as unit 510, which comprises a TEG and an air cooler. A recuperator 506 may be energetically and/or fluidically coupled to a separator 508. Separator 508 may be fluidically and/or energetically coupled to one or more TEGs, heat exchangers, and/or air coolers at TEG unit 514, such as via one or more compressors 538 and/or pumps 540. In addition, any arrow connecting any two system components shown in FIG. 5 may indicate that the two components are either or both fluidically and energetically coupled.

In operation, fuel from fuel source 542 such as natural gas (NG) and oxygen from oxygen source 548 are preheated in preheaters 526 and 528 respectively prior to introduction to combustor 502. Fuel may alternatively comprise any of the fuel types provided in the foregoing. Preheating fuel is to about 350° C. Alternatively, from about 250° C. to about 300° C., about 300° C. to about 350° C., about 350° C. to about 400° C., about 400° C. to about 450° C., or any ranges therebetween. Preheating oxygen is to about 500° C. Alternatively, from about 250° C. to about 400° C., about 400° C. to about 500° C., about 500° C. to about 600° C., or any ranges therebetween. After passing through preheater 528, preheated $O_2$ 550 may be split into two influx streams: oxygen 554 to the SOFC 504 and a low pressure $O_2$ influx stream 552 to combustor 502 via compressor 532. Compressor 532 converts a low pressure $O_2$ stream 552 to high pressure $O_2$ stream 558 having a temperature of about 500° C. Low pressure $O_2$ stream 552 may have a pressure of about 1 bar to about 7 bar. Alternatively, from about 1 bar to about 2 bar, about 2 bar to about 2.5 bar, about 2.5 bar to about 3 bar, about 3 bar to about 3.5 bar, about 3.5 bar to about 4 bar, about 4 bar to about 7 bar or any ranges therebetween. High pressure $O_2$ stream 558 may have a pressure of about 300 bar. Alternatively, from about 30 bar to about 100 bar, about 100 bar to about 200 bar, about 200 bar to about 250 bar, about 250 bar to about 300 bar, about 300 bar to about 350 bar, about 350 bar to about 400 bar, about 400 bar to about 500 bar, or any ranges therebetween. Likewise, preheated fuel 543 may be split into two influx streams: preheated fuel 556 to the SOFC 504 and a second fuel influx stream 544 to the combustor 502 via compressor 530. Second fuel influx stream 544 is pressurized by compressor 530 prior to being introduced to combustor 502.

Upon entering SOFC 504, preheated fuel 556 is at least partially oxidized by oxygen 554 to generate heat, power, oxygen effluent stream 565, and a fuel cell exhaust 569 comprising $CH_4$, CO, and $CO_2$. Heat generated by the SOFC 504 is directed to a TEG within unit 510 to generate power. In addition, unit 510 functions as an air cooler and transfers excess heat away from SOFC 504. SOFC 504 may also intake turbine exhaust 564, comprising mainly carbon dioxide and water. Turbine exhaust 564 may be used to heat SOFC 504 to a temperature between about 800° C. and about 820° C. Alternatively, to any of the operating temperature herein provided for SOFC 200. In addition, one or more internal regions of SOFC 504 may have an operating pressure of about 8 bar. Alternatively, to any of the operating pressures herein provided for SOFC 200. The extent of reaction for oxidizing preheated fuel 556 in SOFC 504 at operating conditions may be, for example, from about 0.01 to about 0.99. The upper limit for extent of oxidation is determined by chemical equilibrium at the temperature and pressure of the SOFC. Conversion of methane, for example, may be as high as 99%. Complete oxidation of preheated fuel 556 to $CO_2$ may be about 0.7. Incomplete oxidation products can be assumed to be CO; however, carbon may also be present. Alternatively, from about 0.01 to about 0.1, about 0.1 to about 0.3, about 0.3 to about 0.5, about 0.5 to about 0.7, or any ranges therebetween. The temperature and pressure of pressurized fuel cell exhaust 571 may be equal to those of the operating conditions of SOFC 504.

Fuel cell exhaust 569 passes through compressor 534. Compressor 534 may pressurize fuel cell exhaust 569 in preparation for introduction to combustor 502. For example, compressors 534 and 536 may pressurize fuel cell exhaust 569 and oxygen effluent stream 565 up to a combustor operating pressure or temperature to form pressurized fuel cell exhaust 571 and pressurized oxygen effluent stream 567. Fuel cell exhaust 569 and/or oxygen effluent stream 565 may have a pressure from about 2 bar to about 8 bar, or any ranges therebetween. Temperature of these streams may be from about 800° C. to about 820° C., or any ranges therebetween.

Pressurized fuel cell exhaust 571 and pressurized oxygen fuel cell effluent stream 567 are then passed to combustor 502, along with additional preheated oxygen from high pressure $O^2$ stream 558 and additional fuel from compressed fuel stream 546. In addition, working fluid 580 from recuperator 506 is passed to combustor 502 to regulate a combustion temperature. The combustor 502 may have an operating temperature of between about 500° C. to about 1600° C. Alternatively, from about 500° C. to about 650° C., about 650° C. to about 700° C., about 700° C. to about 750° C., about 750° C. to about 800° C., about 800° C. to about 850° C., about 850° C. to about 900° C., about 900° C. to about 950° C., about 950° C. to about 1000° C., about 1000° C. to about 1050° C., about 1050° C. to about 1100° C., about 1100° C. to about 1150° C., about 1150° C. to about 1200° C., about 1200° C. to about 1600° C., or any ranges therebetween. In addition, an operating pressure of combustor 502 may be in a range of about 30 bar to about 500 bar. Alternatively, about 30 bar to about 100 bar, about 100 bar to about 200 bar, about 200 bar to about 250 bar, about 250 bar to about 300 bar, about 300 bar to about 350 bar, or about 350 bar to about 500 bar.

Combustion occurs within combustor 502 to form a combustion exhaust 560. Combustion exhaust 560 may have the same temperature and pressure as the internal operating conditions of the combustor. As illustrated, combustion exhaust 560 is fed to turbine 516, where it generates power and forms turbine exhaust 562. Turbine exhaust 562 will have a reduced pressure in comparison to combustion exhaust 560. For example, turbine exhaust 562 may have a pressure of about 30 bar. Alternatively, from about 5 bar to about 10 bar, about 10 bar to about 20 bar, about 20 bar to about 25 bar, about 25 bar to about 30 bar, about 30 bar to about 35 bar, about 35 bar to about 40 bar, about 40 bar to about 50 bar, or any ranges therebetween. Turbine exhaust 562 may have a high temperature, such as a temperature of about 820° C., or a temperature greater than 800° C. Alternatively, from about 500° C. to about 650° C., about 650° C. to about 820° C., about 820° C. to about 1000° C., about 1000° C. to about 1150° C., about 1150° C. to about 1500° C., or any ranges therebetween. Working fluid 580 introduced into the combustor may help to regulate a flame temperature therein. As mentioned, working fluid may comprise carbon dioxide, water, or both, as well as trace amounts (≤5 vol. %) of inert gas such as argon or nitrogen.

Heat from turbine exhaust 562 may be transferred to PCM 520. PCM 520 may be thermally coupled to a fluid conduit, such as a fluid conduit carrying turbine exhaust 562. PCM 520 may reduce the temperature of turbine exhaust 562 to about 820° C. Alternatively, to a temperature of from about 500° C. to about 600° C., about 600° C. to about 700° C., about 700° C. to about 750° C., about 750° C. to about 800° C., about 800° C. to about 850° C., or any ranges therebetween. Turbine exhaust 564 may be subsequently fed to a SOFC 504 and provide heat thereto. Turbine exhaust 564 may be introduced to an inner region of SOFC 504 solely for the purpose of heat transfer. The turbine exhaust 564 may pass through the SOFC and impart heat to the SOFC before passing as exhaust 566, 568, 570, 572, and 574 through one or more regions in thermal communication with one or more PCMs 522 and 524 and/or regions in thermal communication with preheaters 526 and 528.

In alternative examples, combustor 502 and turbine 516 may be replaced with a combustor/turbine 599. Combustor/turbine 599 may, in some examples, comprise combustor/turbine 104 (e.g., referring to FIG. 1). It should be understood that particular arrangements of components in certain examples described herein may be interchanged with other arrangements of components in other examples. For example, one or more elements of power generation system 600 (referring to FIG. 6) may be incorporated into power generation 500, and vice versa. For example, the many references to turbine exhaust made throughout this disclosure may be substituted for a combustion exhaust, and power generation may proceed with or without a turbine directly coupled to combustor 502.

Exhaust 566 may have a temperature of about 800° C. Alternatively, from about 700° C. to about 750° C., about 750° to about 800°, about 800° to about 850°, or any ranges therebetween. Exhaust 578 may then pass to recuperator 506 and form a recuperator exhaust 582. Recuperator 506 may comprise a heat exchanger and/or transfer any remaining heat from the exhaust 578 to working fluid 580. Working fluid 580 has a temperature of about 700° C., and a pressure of about 300 bar. Alternatively, a temperature from about 600° C. to about 650° C., about 650° C. to about 700° C., about 700° C. to about 750° C., about 750° C. to about 800° C., or any ranges therebetween.

Recuperator exhaust 582 is then introduced to separator 508, having a pressure and temperature of about 30 bar and 35° C. respectively. Alternatively, a pressure from about 10 bar to about 20 bar, about 20 bar to about 30 bar, about 30 bar to about 40 bar, or any ranges therebetween, and/or a temperature from about 10° C. to about 20° C., about 20° C. to about 30° C., about 30° C. to a bout 40° C., about 40° C. to about 50° C., or any ranges therebetween. In some examples, following introduction to the recuperator 506, at least a portion of exhaust 578 may be combined with carbon dioxide 598 and reintroduced to the combustor 502 as a part of working fluid 580.

In the illustrated example, recuperator exhaust 582 is passed to separator 508. The separator 508 may perform a separation on the recuperator exhaust 582 to form a water enriched stream 584 and a carbon dioxide enriched stream 586. The water enriched stream 584 may be used for any suitable purpose, such as for recycling in one or more heat exchangers. Water enriched stream 584 may comprise pure water. Alternatively, water may be present in water enriched stream 584 in an amount from about 75% to about 85%, about 85% to about 95%, about 95% to about 100%, or any ranges therebetween. Likewise, carbon dioxide enriched stream 586 may comprise pure carbon dioxide. Alternatively, carbon dioxide may be present in carbon dioxide enriched stream 586 in an amount from about 75% to about 85%, about 85% to about 95%, about 95% to about 100%, or any ranges therebetween. As illustrated, carbon dioxide enriched stream 586 is passed to compressor 538 and compressed, forming a compressed $CO_2$ stream 588 having a pressure of about 80 bar. Alternatively, from about 50 bar to about 60 bar, about 60 bar to about 70 bar, about 80 bar to about 90 bar, about 90 bar to about 100 bar, or any ranges therebetween. Compression of carbon dioxide enriched stream 586 is exothermic and generates heat. Heat from compressed $CO_2$ stream 588 is then passed through TEG unit 512 comprising one or more TEGs in accordance with the present disclosure. TEG unit 512 may also comprise one or more heat exchangers and/or air coolers.

As illustrated, after passing through unit 512, at least a portion of the carbon dioxide from compressed $CO_2$ stream 588 is removed as pipeline carbon dioxide 592. Pipeline carbon dioxide 592 may be pipeline grade and may have the same pipeline pressure herein provided for stream 144 (e.g., referring to FIG. 1). The remaining portion 594 of carbon dioxide enriched stream 590 is passed to TEG unit 514 for additional removal of excess heat. Like TEG unit 512, TEG unit 514 may comprise one or more TEGs in accordance with the present disclosure, as well as one or more heat exchangers and/or air coolers. From TEG unit 514, carbon dioxide enriched stream 596 is passed to pump 540. Pump 540 may comprise any pumping mechanism suitable for recycling carbon dioxide to recuperator 506, such as a centrifugal pump. Alternatively, a positive-displacement pump, an axial-flow pump, a propeller pump, or the like. From pump 540, recycled carbon dioxide stream 598 is passed to recuperator 506 having a temperature of about 30° C. Alternatively, from about 20° C. to about 30° C., about 30° C. to about 40° C., about 40° C. to about 50° C., or any ranges therebetween.

One advantage of introducing the fuel cell exhaust to the combustor after oxidization is that it eliminates the need of a tail gas oxidizer and/or afterburner typically needed to treat fuel cell exhaust.

Figure 6:
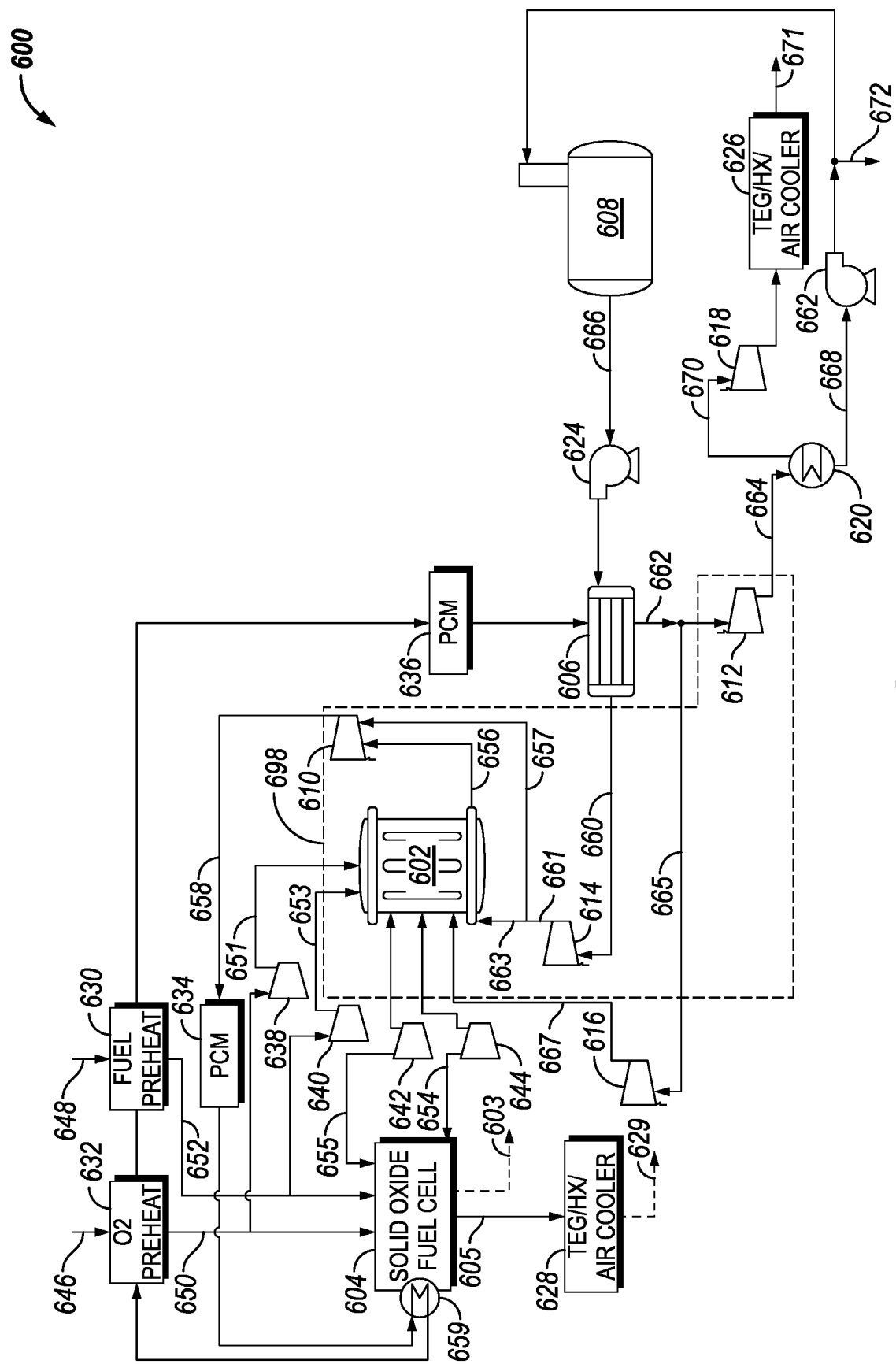
FIG. 6 illustrates an example direct-fired oxy-fuel S-Graz cycle with recycled $CO_2/H_2O$ and a solid oxide fuel cell, thermoelectric generators, and phase change materials incorporated therein.

FIG. 6 illustrates a direct-fired oxy-fuel S-Graz cycle with recycled $CO_2/H_2O$ and SOFC, TEGs, and PCMs incorporated therein. As shown, a power generation system 600 may comprise a combustor 602 and a SOFC 604. As with FIG. 5, SOFC 504 may be substituted for any of the fuel cells previously described in the foregoing. The system may further comprise a deaerator 608, a condenser 620, a heat recovery steam generator 606 (HRSG 606), an oxygen source 646, a fuel source 648, one or more PCM modules 634 and 636, one or more TEG/cooling units 626 and 628, a high temperature turbine 610, a high pressure turbine 614, a low pressure turbine 612, one or more pumps 622 and 624, compressors 616, 618, 638, 640, 642, and 644 one or more heat exchangers, and PCM sections 634 and 636, fuel preheat module 630 and PCM module 634. An oxygen source 646 and/or fuel source 648 may be fluidically and/or energetically coupled to either or both combustor 602 and SOFC 604, such as via one or more compressors. The SOFC 604 may be in fluidic and/or energetic communication with combustor 602, such as via one or more compressors 642 and 644. In addition, combustor 602 may be in fluidic and/or energetic communication with high temperature turbine 610 (HTT 610), low-pressure turbine 612 (LPT 612), and high-pressure turbine 614 (HPT 614). One or more PCM modules 634 and 636 may be disposed throughout the system in any suitable location, such as before HRSG 606 and/or after high pressure turbine 610. An HRSG 606 may be fluidically and/or energetically coupled to a deaerator 608, such as via a low-pressure turbine 612, a pump 622, and a condenser 620. Condenser 620 may be fluidically and/or energetically coupled to a compressor 618, and compressor 618 may be energetically and/or fluidically coupled to any of a TEG/cooling unit 626, heat exchanger, and/or air cooler. A deaerator 608 may be in fluidic and/or energetic communication with HRSG 606, such as via a feed pump 624. HRSG 606 may be in fluidic and/or energetic communication with combustor 602, such as via HPT 614. HPT 614 may be in energetic and/or fluidic communication with HTT 610. In addition, any arrow connecting any two system components shown in FIG. 6 may indicate that the two components are either or both fluidically and energetically coupled.

In operation, fuel from a fuel source 648 and oxygen from an oxygen source 646 may be preheated prior to introduction to combustor 601 and/or SOFC 604. Preheating temperature may include the temperature ranges previously described, such as those of preheated fuel 543 and preheated $O_2$ 550 heated by preheaters 526 and 528 (e.g., referring to FIG. 5) Likewise, pressure conditions of oxygen stream 650 and fuel streams 652 may include the pressure conditions of low pressure $O_2$ influx stream 552 and oxygen 554 respectively (e.g., referring to FIG. 5). In some examples, oxygen stream 650 and fuel streams 652 may be pressurized by, for example, one or more compressors. As illustrated, oxygen stream 650 and fuel stream 652 are passed to SOFC 604. Oxidation of fuel may occur in SOFC 604 as previously described throughout this disclosure, such as for SOFC 504 or SOFC 200 (e.g., referring to FIGS. 2 and 5), and may result in fuel exhaust 655 and oxygen effluent 654. Power 629 is generated by oxidation of fuel. Fuel exhaust 655 is then passed through compressor 642 in preparation for introduction to combustor 502, thereby increasing stream pressure closer to the operating condition of combustor 602. Alternatively, fuel exhaust 655 is pressurized by compressor 642 to the pressure ranges herein provided for pressurized fuel cell exhaust 571 (e.g., referring to FIG. 5). Likewise, oxygen effluent 654 is pressurized by compressor 644 in preparation for introduction to combustor 602. Alternatively, oxygen effluent 654 is pressurized to the pressure ranges herein provided for stream 567 (e.g., referring to FIG. 5).

Heat generated by SOFC 604 may be conveyed to TEG/cooling unit 628 via thermal communication link 605. Thermal communication link 605 may comprise one or more heat exchanger, or a thermal connection between a heated region of SOFC 604 and a heat accepting surface of TEG unit 328, such as a hot side plate 372 of a TEG module 301 (e.g., referring to FIG. 3e) or hot surface 303 (e.g., referring to FIG. 3c) to generate power 629. TEG unit 328 may comprise one or more TEG modules, such as TEG module 301 (e.g., referring to FIGS. 3d and 3e), and optionally, an air cooler and/or heat exchanger.

In the illustrated example, a bypass portion 651 of oxygen is removed from oxygen stream 650 and passed to compressor 638 to be directly injected into combustor 602. After compression in compressor 638 to form pressurized bypass portion 651, pressurized bypass portion 651 has a temperature of about 600° C. Alternatively, from about 500° C. to about 550° C., about 550° C. to about 600° C., about 600° C. to about 650° C., about 650° C. to about 700° C., about 700° C. to about 850° C., or any ranges therebetween. As illustrated, a bypass portion 653 of fuel is likewise removed from fuel stream 652 and passed to compressor 640 to be directly injected into combustor 602. Temperature and pressure conditions for bypass portion 653 may include those herein provided for bypass portion 651.

Upon injection into combustor 602, fuel from fuel source 648 is combusted in the presence of oxygen from oxygen source 646 as well as recycled working fluid 663. Working fluid 663 may comprise carbon dioxide and water, and optionally, small amounts (≤5 wt. %) of inert gas, such as argon or nitrogen. Operating conditions of combustor 602 and therefore combustion exhaust 656 may be about 40 bar and about 1400° C. Alternatively, in the ranges herein disclosed for combustor 502 (e.g., referring to FIG. 5), or having a pressure from about 15 bar to about 30 bar, about 30 bar to about 40 bar, about 40 bar to about 50 bar, about 50 bar to about 60 bar, or any ranges therebetween, and/or having a temperature from about 1100° C. to about 1200° C., about 1200° C. to about 1300° C., about 1300° C. to about 1400° C., about 1400° C. to about 1500° C., about 1500° C. to about 1600° C., or any ranges therebetween. Combustion is allowed to occur within combustor 602 to generate combustion exhaust 656. As illustrated, combustion exhaust 656 is then passed to HTT 610 to generate power and HTT exhaust 658. Steam 657 is passed to HTT 610 from HPT 614 along with combustion exhaust 656.

A temperature and pressure of HTT exhaust 658 may include the ranges herein disclosed for turbine exhaust 562 (e.g., referring to FIG. 5). Alternatively, about 570° C. and about 1 bar. Yet alternatively, from about 450° C. to about 500° C., about 500° C. to about 550° C., about 550° C. to about 600° C., or any ranges therebetween. HTT exhaust 658 may be passed to PCM module 634 where heat may be transferred thereto and/or therefrom. As previously discussed, PCMs of PCM modules 634 and 636 may serve to provide thermal inertia to power generation system 600, thereby mitigating unwanted spikes and dips in operating conditions. In operation, heat is transferred from HTT exhaust 658 to PCM module 634 before passing through a heat exchanger 659 operably coupled to SOFC 604. After passing through heat exchanger 659, HTT exhaust 658 is passed through $O_2$ preheat module 632 and fuel preheat module 630 where heat is transferred from HTT exhaust 658 to oxygen stream 650 and fuel stream 652.

As with a previous example, in alternative examples, combustor 602 and HTT 610, LPT 612, and HPT 614 may be replaced with a combustor/turbine 698 as illustrated by the dotted line. In such examples, combustor/turbine 698 may be substituted with combustor/turbine 104 (e.g., referring to FIG. 1).

In the illustrated example, after passing through fuel preheat module 630, HTT exhaust 658 passes through an additional PCM module 636. Heat transfer is allowed to take place between PCM module 636 and HTT exhaust 658. Following PCM module 636, HTT exhaust 658 is introduced to HRSG 606. HRSG 606 is a heat recovery steam generator which uses heat from HTT exhaust 658 to convert de-aerated water 666 into steam 660. Steam 660 may comprise superheated steam. Steam 660 has a pressure of about 180 bar and a temperature of about 565° C. Alternatively, a pressure from about 50 bar to about 100 bar, about 100 bar to about 150 bar, about 150 bar to about 200 bar, about 200 bar to about 300 bar, or any ranges therebetween, and/or a temperature from about 250° C. to about 400° C., about 400° C. to about 500° C., about 500° C. to about 600° C., about 600° C. to about 800° C., or any ranges therebetween.

As illustrated, after exiting HRSG 606, steam 660 passes through an HPT 614 to generate HPT exhaust 661. Steam 657 of HPT exhaust 661 is passed to HTT 610, and working fluid 663 is injected into combustor 602. As with previous working fluids previously mentioned hereto, working fluid 663 may function to regulate an internal combustion temperature within combustor 602 and precisely control rate of combustion.

After introduction to HRSG 606, HTT exhaust 658 is cooled to a temperature of about 560° C. Alternatively, from about 400° C. to about 500° C., about 500° C. to about 550° C., about 550° C. to about 600° C., about 600° C. to about 700° C., or any ranges therebetween. HTT exhaust 658 is then passed through LPT 612 to generate LPT exhaust 664 and power. As illustrated, prior to introduction of HTT exhaust 658 to LPT 612, a bypass portion 665 is removed and passed to compressor 616. Bypass portion 665 may be pressurized in compressor 616 to an operating pressure of combustor 601 to form a working fluid 667. Working fluid 667 may have a temperature of about 600° C. Alternatively, from about 400° to about 500°, about 500° C. to about 575° C., about 575° C. to about 615° C., about 615° C. to about 700° C., about 700° C. to about 800° C., or any ranges therebetween. Working fluid 667 may comprise combustion products from combustion in combustor 602 including, without limitation, carbon dioxide, water, small amounts of carbon monoxide, trace amounts of inert gas (e.g., nitrogen or argon), trace amounts of sulfur dioxide, nitrogen oxides, particular matter, etc. For example, carbon dioxide may be present in working fluid 667 in an amount from about 1 vol. % to about 100 vol. %. Alternatively, from about 25 vol. % to about 35 vol. %, about 35 vol. % to about 45 vol. %, about 45 vol. % to about 55 vol. %, about 65 vol. % to about 75 vol. %, about 75 vol. % to about 85 vol. %, about 85 vol. % to about 95 vol. %, or any ranges therebetween. Water may likewise be present in working fluid 667 in an amount from about 0 vol. % to about 100 vol. %. Alternatively, from about 0 vol. % to about 1 vol. %, about 1 vol. % to about 25 vol. % to about 35 vol. %, about 35 vol. % to about 45 vol. %, about 45 vol. % to about 55 vol. %, about 65 vol. % to about 75 vol. %, about 75 vol. % to about 85 vol. %, about 85 vol. % to about 95 vol. %, or any ranges therebetween. Oxygen may be present in working fluid 667 in an amount less than 50 ppm.

In the illustrated example, LPT exhaust 664 is passed to a condenser 620 where water is condensed into bottoms stream 668 and carbon dioxide remains in a vapor phase and is passed to overhead stream 670. LPT exhaust 664 may have a pressure of about 0.04 bar. Alternatively, from about 0 bar to about 0.05 bar, about 0.05 bar to about 0.1 bar, about 0.1 bar to about 0.5 bar, about 0.5 bar to about 1 bar, about 1 bar to about 2 bar, about 2 bar to about 3 bar, or any range therebetween. LPT exhaust 664 may have a temperature from about 29° C. to about 50° C., or any ranges therebetween.

Upon exiting condenser 620, bottoms stream 668 may be passed to a pump 622. In one or more examples, excess water may be removed from system 600. As illustrated, bottoms stream 668 is then passed to deaerator 608 where water from bottoms stream 668 is de-aerated to form de-aerated water 666. Deaerator 608 may be any suitable form of deaeration device including without limitation a thermal deaerator, a spray and tray-type deaerator, a spray-type deaerator, a vacuum deaerator, an ultrasound deaerator, or the like. Deaerator 608 may function to remove dissolved gases such as carbon dioxide trapped in the portion of bottoms stream 668 that is fed thereto. Oxygen may be present in de-aerated water 666 in an amount less than 10 ppm.

From the deaerator 608, de-aerated water 666 is passed to HRSG 606 for vaporization and conversion to steam at HRSG 606. Overhead stream 670, comprising pure or nearly pure carbon dioxide, is based to compressor 618 where it is pressurized. After pressurization, overhead stream 670 is passed to TEG/cooling unit 626, where at least a portion of heat is removed and converted to power. An exit stream 671 comprising pipeline grade $CO_2$ is removed to be transported away and/or stored for sequestration, subsurface geological storage, utilization, or the like.

Figure 7:
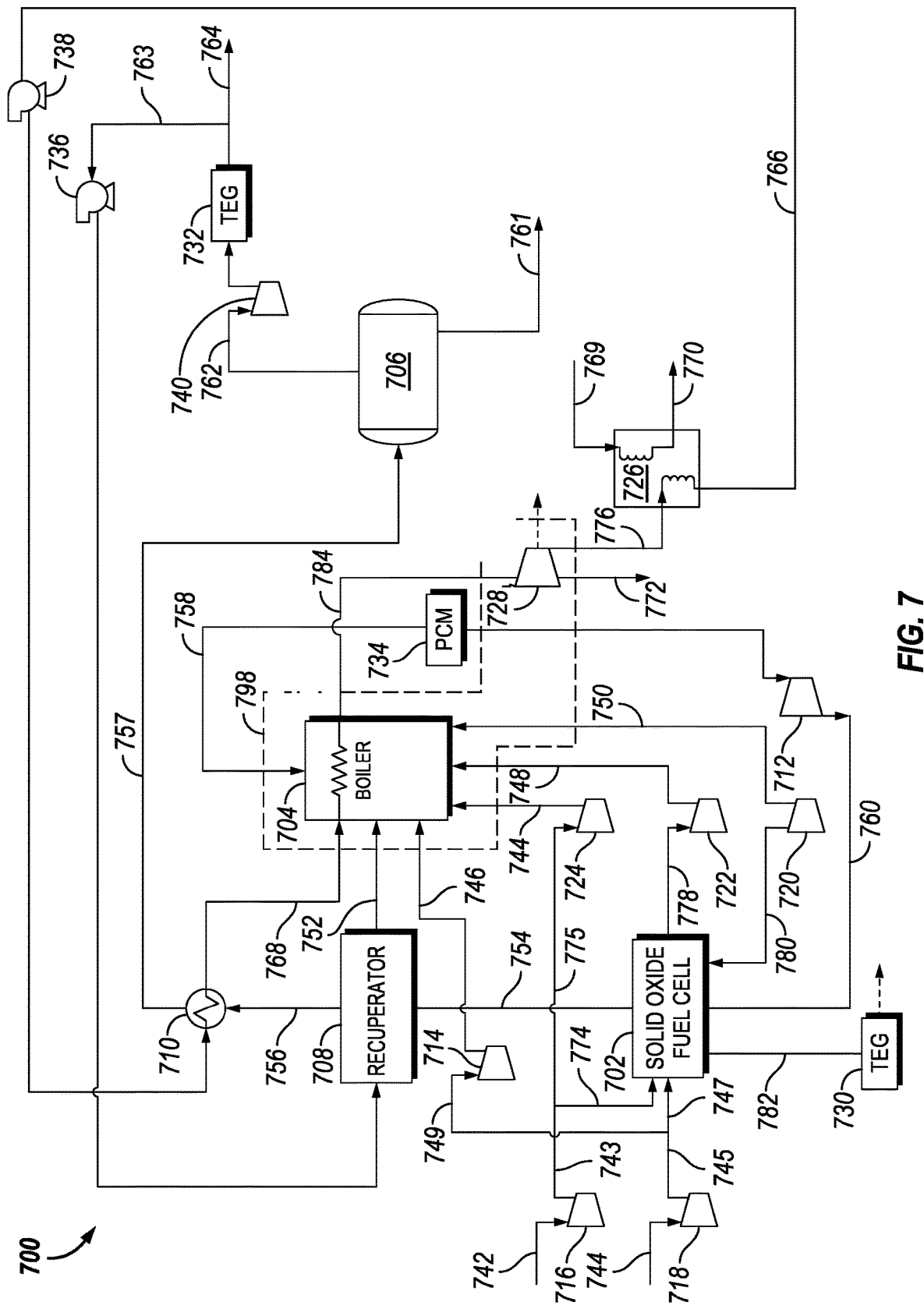
FIG. 7 illustrates an example oxy-fuel Rankine cycle with a solid oxide fuel cell, thermoelectric generators, and phase change materials incorporated therein.

FIG. 7 illustrates an oxy-fuel ultra-supercritical simple Rankine cycle with a steam turbine, SOFC, TEG, and PCMs. Supercritical cycles may generally be characterized as having a maximum pressure greater than a critical pressure. As shown, a power generation system 700 may generally comprise a SOFC 702, boiler 704, separator 706, recuperator 708, steam turbine 728, and condenser 726. The system may also comprise heat exchanger 710, water pump 738, $CO_2$ pump 736, expander 712, compressors 720, 722, 724, 714, 716, 718, 740, and TEG units 732, 730. As with previous figures, it should be noted that any line or arrow connecting any two system components shown may indicate that the two components are directly or indirectly fluidically and/or energetically coupled.

In operation, fuel from fuel source 742 and oxygen from oxygen source 744 are passed through compressors 716 and 718 respectively. As illustrated, a first portion 747 of pressurized oxygen 745 is then introduced into SOFC 702, a first portion 774 of pressurized fuel 743 is also introduced into SOFC 702. Pressurized fuel 743 may have a pressure of about 30 MPa. Alternatively, from about 10 bar to about 20 bar, about 20 bar to about 30 bar, about 30 bar to about 40 bar, about 40 bar to about 50 bar, or any ranges therebetween. One or more preheater modules may be incorporated into system 700 to preheat oxygen from oxygen source 744 and/or fuel from fuel source 742 prior to and in preparation for introduction to SOFC 702.

Oxidation of fuel occurs in SOFC 702 to generate excess fuel 778, oxygen effluent 780. Operating conditions of SOFC may include temperature and pressure ranges herein included for SOFC 200 (e.g., referring to FIG. 2). As illustrated, heat may be transferred via thermal communication link 782 to TEG unit 730, whereby power is generated.

As illustrated, expanded boiler exhaust 760 may be passed through SOFC 702 to form a fuel cell exhaust 754. Heat from the expanded boiler exhaust 760 may be transferred to SOFC 702 via direct or indirect thermal communication. Fuel cell exhaust 754 is passed through a recuperator 708 to recover at least a portion of heat therefrom. Recuperator 708 may comprise a recuperator 506 as previously shown and described (e.g., FIG. 5). Prior to introduction to recuperator 708, fuel cell exhaust may have a temperature of about 600° C. Alternatively, from about 400° C. to about 500° C., about 500° C. to about 550° C., about 550° C. to about 600° C., about 600° C. to about 650° C., about 650° C. to about 750° C., or any ranges therebetween. As illustrated, heat may be transferred from fuel cell exhaust 754 to water 766. Upon entering recuperator 708, temperature of fuel cell exhaust 754 may be reduced to about 150° C. to form a recuperator exhaust 756. Alternatively, from about 50° C. to about 75° C., about 75° C. to about 100° C., about 100° C. to about 200° C., or any ranges therebetween. Further heat may be recovered from recuperator exhaust 756 via heat exchanger 710. After exiting recuperator 708 and passing through heat exchanger 710, exhaust 757 is passed to separator 706, to be discussed in more detail later on.

Upon exiting SOFC 702, excess fuel 778 is pressurized by compressor 722 in preparation for introduction to boiler 704 as first pressurized fuel 748. Likewise, oxygen effluent 780 is pressurized by compressor 720 to form pressurized oxygen 750 prior to introduction to boiler 704. In addition, second portion 775 of pressurized fuel 743 is passed through compressor 724 to be injected into boiler 704 as additional pressurized fuel 751. Likewise, a second portion 749 of pressurized oxygen 745 is passed to compressor 714 prior to introduction to boiler 704 as additional pressurized oxygen 746. Any of pressurized oxygen 750, additional pressurized oxygen 746, pressurized fuel 743, and/or additional pressurized fuel 751 may have a pressure suitable for introduction to boiler 704 including, for example, an operating pressure of boiler 704. Alternatively, from about 30 bar to about 100 bar, about 100 bar to about 200 bar, about 200 bar to about 300 bar, about 300 bar to about 400 bar, about 400 bar to about 500 bar, or any ranges therebetween. $CO_2$ working fluid 752 may be additionally passed to boiler 704 to regulate a combustion rate and combustion temperature within boiler 704.

As alluded to previously, combustion of fuel from pressurized fuel 743 and additional pressurized fuel 751 may occur in the presence of oxygen from additional pressurized oxygen 746, pressurized oxygen 745 and carbon dioxide from working fluid 752.

Heat generated by combustion within boiler 704 serves to convert water stream 768 to steam 784. Steam 784 may be superheated. In one or more examples, steam 784 may comprise a supercritical fluid, and in some examples, an ultra-supercritical fluid. For example, prior to heating, water stream 768 may have a pressure of about 300 bar and a temperature of about 80° C. Alternatively, from about 50° C. to about 70° C., about 70° C. to about 90° C., about 90° to about 100° C., or any ranges therebetween. After heating, steam 784 may have a pressure and temperature of about 300 bar and about 620° C. Alternatively, steam 784 may have a temperature from about 400° C. to about 500° C., about 500° C. to about 600° C., about 600° C. to about 650° C., about 650° C. to about 700° C., about 700° C. to about 800° C., or any ranges therebetween. Steam 784 and/or water stream 768 may alternatively have a pressure from about 30 bar to about 100 bar, about 100 bar to about 200 bar, about 200 bar to about 300 bar, about 300 bar to about 400 bar, about 400 bar to about 500 bar, or any ranges therebetween.

As illustrated, combustion of fuel in boiler 704 generates combustion exhaust 758. Combustion exhaust has a pressure of about 300 bar. Alternatively, from about 100 bar to about 200 bar, about 200 bar to about 300 bar, about 300 bar to about 400 bar, or any ranges therebetween. After combustion, combustion exhaust 758 is passed to an expander 712. Expander 712 functions to convert combustion exhaust 758 to expanded boiler exhaust 760. Expanded boiler exhaust has a pressure of about 30 bar. Alternatively, from about 10 bar to about 20 bar, about 20 bar to about 30 bar, about 30 bar to about 40 bar, or any ranges therebetween. Expander 712 may comprise without limitation a turboexpander, an expansion turbine, or the like, through which high pressure gases may pass. Some of the energy contained by combustion exhaust 758 may be harnessed by expander 712 to produce work which may in turn be used to drive any one or all of compressors 716, 718, 720, 722, and 724. Prior to introduction to expander 712, heat may be transferred to PCM 734 to and/or from combustion exhaust 758. As with previous examples, PCM 734 may be operable to increase an amount of heat inertia present at any given time during operation of power generation system 700, thereby mitigating dips and spikes in demand. The temperature of combustion exhaust 758 may be about 650° C. after passing through PCM 734.

As with previous examples, in alternative examples, boiler 704 and steam turbine 728 may be replaced with a combustor/turbine 798 as illustrated by the dotted line. In such examples, combustor/turbine 798 may be substituted with combustor/turbine 104 (e.g., referring to FIG. 1).

In the illustrated example, steam 784 is passed through steam turbine 728 to generate a turbine exhaust 776, process steam 772 and power. Turbine 728 may comprise any suitable turbine for extracting thermal energy from steam. Upon passing through turbine 728, turbine exhaust 776 may have a reduced pressure. For example, turbine exhaust 776 may have a pressure from about 1 bar to about 300 bar. Alternatively, from about 1 bar to about 3 bar, about 3 bar to about 7 bar, about 7 bar to about 15 bar, about 15 bar to about 50 bar, about 50 bar to about 100 bar, about 100 bar to about 200 bar, about 200 bar to about 300 bar, or any ranges therebetween. After passing through turbine 728, turbine exhaust 776 is passed to condenser 726 to form water 766. Cooling water 769 may be used in condenser 726 to extract heat from turbine exhaust 776 and may function as a heat sink, thereby forming water effluent 770. Water 766 is in a liquid phase and is then passed through water pump 738 in preparation for reintroduction to boiler 704. After passing through water pump 738, water 766 has a pressure of about 300 bar and a temperature of about 30° C. Alternatively, a pressure from about 100 bar to about 200 bar, about 200 bar to about 300 bar, about 300 bar to about 400 bar, or any ranges therebetween, and/or a temperature from about 15° C. to about 25° C., about 25° C. to about 35° C., about 35° C. to about 45° C., or any ranges therebetween. As illustrated, water 766 is also passed through heat exchanger 710, wherein heat is imparted thereto from recuperator exhaust 756.

As previously mentioned, after recuperator exhaust 756 is passed through heat exchanger 710, exhaust 757 is formed and introduced to separator 706. Exhaust 757 may comprise one or more combustion products from combustion in boiler 704, one or more oxidation products from oxidation of fuel in 702, unreacted fuel, and unreacted oxygen. Exhaust 757 comprises carbon dioxide and water, having a temperature of about 35° C. and a pressure of about 3 MPa. Alternatively, a temperature from about 20° C. to about 30° C., about 30° C. to about 40° C., about 40° C. to about 50° C., or any ranges therebetween, and/or a pressure of about 1 MPa to about 2 MPa, about 2 MPa to about 3 MPa, about 3 MPa to about 4 MPa, about 4 MPa to about 5 MPa, or any ranges therebetween. Carbon dioxide may be present in exhaust 757 in an amount from about 25 wt. % to about 85 wt. %. Alternatively, from about 25 wt. % to about 35 wt. %, about 35 wt. % to about 45 wt. %, about 45 wt. % to about 55 wt. %, about 55 wt. % to about 65 wt. %, about 65 wt. % to about 75 wt. %, about 75 wt. % to about 85 wt. %, or any ranges therebetween. Likewise, water may be present in exhaust 757 in an amount from about 25 wt. % to about 85 wt. %. Alternatively, from about 25 wt. % to about 35 wt. %, about 35 wt. % to about 45 wt. %, about 45 wt. % to about 55 wt. %, about 55 wt. % to about 65 wt. %, about 65 wt. % to about 75 wt. %, about 75 wt. % to about 85 wt. %, or any ranges therebetween. Separator 706 separates exhaust 757 into a water enriched stream 761 and a $CO_2$ enriched stream 762. $CO_2$ enriched stream may comprise pure carbon dioxide.

After exiting separator 706, $CO_2$ enriched stream 762 is passed through compressor 740 prior to introduction to TEG unit 732 to generate power. As with previous examples, TEG unit 732 may comprise a TEG, such as those shown and described in FIGS. 3*a*-3*e*. TEG unit 732 may also comprise one or more air coolers and/or heat exchangers. A pressure of $CO_2$ enriched stream 762 after passing through compressor 740 may be about 8 MPa. Alternatively, from about 4 MPa to about 6 MPa, about 6 MPa to about 7 MPa, about 7 MPa to about 8 MPa, about 8 MPa to about 9 MPa, about 9 MPa to about 11 MPa, or any ranges therebetween. As illustrated, a first portion 763 of $CO_2$ enriched stream 762 is passed through a $CO_2$ pump 736 prior to introduction to recuperator 708 in preparation for introduction to boiler 704 as working fluid 752. After passing through pump 736, first portion 763 has a pressure of about 300 bar and a temperature of about 16° C. Alternatively, a pressure from about 100 bar to about 200 bar, about 200 bar to about 300 bar, about 300 bar to about 400 bar, or any ranges therebetween, and/or a temperature from about 10° C. to about 20° C., about 20° C. to about 30° C., about 30° C. to about 40° C., or any ranges therebetween. A second portion 764 comprising pipeline grade $CO_2$ is removed to be transported away and/or stored for sequestration, subsurface geological storage, utilization, or the like.

While TEG units 730 and 732 are shown in specific locations in power generation system 700, it should be understood that the principles shown and described herein may be applied to any appropriate region of power generation system 700 to maximize a power generation efficiency thereof.

Figure 8:
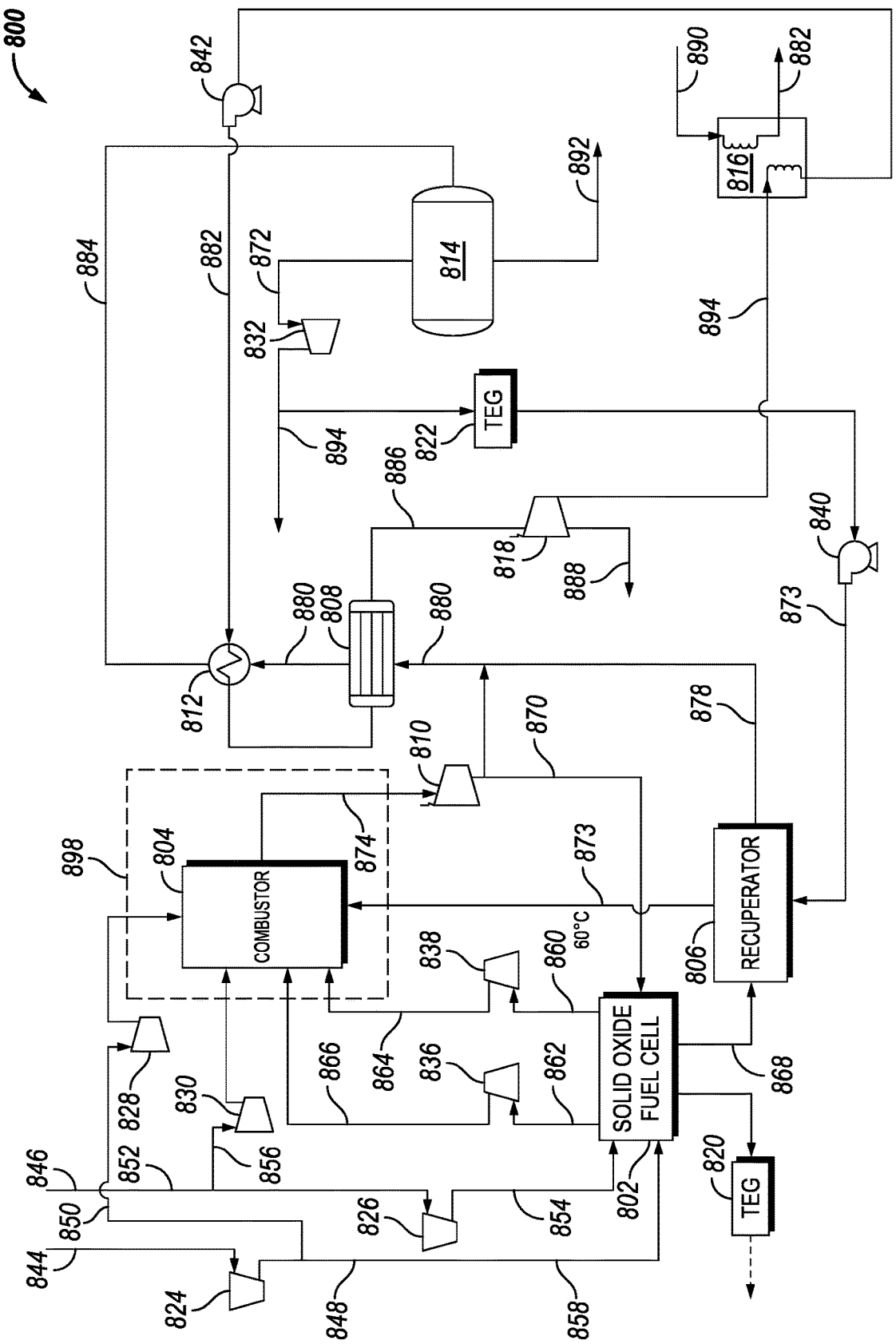
FIG. 8 illustrates an example oxy-fuel hybrid Brayton/Rankine cycle with a solid oxide fuel cell, thermoelectric generators, and phase change materials incorporated therein.

FIG. 8 illustrates a hybrid Brayton/Rankine cycle with a SOFC 802 and TEG units 820 and 822. As shown, a power generation system 800 generally comprises a SOFC 802, a combustor 804, a heat recovery steam generator 808, and a recuperator 806. In addition, power generation system 800 may comprise one or more TEGs, an accumulator 814, a $CO_2$ pump 840, a water pump 842, one or more compressors 824, 826, 828, 836, 838, a condenser 816, a heat exchanger 812. As with previous figures, it should be noted that any line or arrow connecting any two system components shown may indicate that the two components are directly or indirectly fluidically and/or energetically coupled.

In operation, fuel from fuel source 844 may be passed to SOFC 802. As illustrated, fuel from fuel source 844 is passed through compressor 824 to form pressurized fuel 848 in preparation for introduction to SOFC 802. Likewise, oxygen from oxygen stream 852 is also passed to compressor 826 to form pressurized oxygen 854 in preparation for introduction to SOFC 802. Additionally, a bypass portion 856 of the oxygen may be diverted from oxygen stream 852. As illustrated, bypass portion 856 is passed through an $O_2$ compressor 830 in preparation for introduction to combustor 804. Likewise, a bypass portion 850 of fuel may be diverted from pressurized fuel 848 and introduced to combustor 804 via, for example, compressor 828.

Oxidation of fuel occurs in SOFC 802 to generate fuel cell exhaust 860 and oxygen effluent 862. As with previous examples, operating conditions of SOFC 802 may include temperature and pressure ranges herein included for SOFC 200 (e.g., referring to FIG. 2). In addition, it should be likewise understood that for the preferred examples, while fuel cell exhaust 868 is shown as exiting SOFC 802, the turbine exhaust 870 is merely passed through SOFC 702 to impart heat thereto and does not take part in oxidation of fuel within SOFC 802.

As illustrated, heat present in SOFC 802 may be transferred via thermal communication link 782 to TEG unit 730, whereby power is generated. TEG unit 730 comprises one or more TEGs in accordance with the present disclosure, such as those shown and described in FIGS. 3*a*-3*e*. As with previous examples, thermal communication link 782 may comprise any form of thermal communication with a heat source and a heat sink and may be operable to conduct heat away from SOFC 802 to TEG unit 820. While specific examples are shown wherein TEG units 820 and 822 may be incorporated, it is noted that TEG units 820 and 822 and/or additional TEG units may be placed in any suitable location throughout power generations system 800.

As illustrated, fuel cell exhaust 860 and oxygen effluent 862 exit SOFC 802 to be passed through compressors 838 and 836 respectively. Compressors 828 and 836 pressurize fuel cell exhaust 860 and oxygen effluent 862 up to a suitable pressure for injection into combustor 804 including, for example, an operating temperature of combustor 804. In addition to fuel and oxygen from pressurized fuel stream 864 and pressurized oxygen effluent 866, carbon dioxide from working fluid 873, as well as fuel and oxygen from bypass portions 856 and 850 may be introduced to combustor 804.

After passing through $CO_2$ pump, working fluid 873 has a temperature of about 16° C. and a pressure of about 300 bar. Alternatively, a temperature from about 10° C. to about 20° C., about 20° C. to about 30°, about 30° C. to about 40° C., or any ranges therebetween, and/or a pressure from about 100 bar to about 200 bar, about 200 bar to about 300 bar, about 300 bar to about 400 bar, or any ranges therebetween. An enthalpy of working fluid 873 may be about 130 kcal/kmol prior to passing through recuperator 806, and about 558 kJ/kg after passing through recuperator 806. Alternatively, an increase in enthalpy of a working fluid 873 from before to after passing through recuperator 806 may be from about 350 kJ/kg to about 400 kJ/kg, about 400 kJ/kg to about 450 kJ/kg, about 450 kJ/kg to about 500 kJ/kg, or any ranges therebetween. The temperature of working fluid 873 after passing through recuperator 806 is 60° C. Alternatively, from about 40° C. to about 50° C., about 50° C. to about 60° C., about 60° C. to about 70°, or any ranges therebetween.

Combustion is allowed to occur within combustor 804. Combustion of fuel generates one or more combustion products, including carbon dioxide and water. Operating conditions of combustor 804 as well as combustion exhaust 874 may include any of the temperature and pressure ranges herein disclosed for combustor 502 (e.g., referring to FIG. 5). The one or more combustion products, working fluid 873, and any unreacted fuel or oxygen exits combustor 804 as combustion exhaust 874 to be passed to turbine 810 for generating power.

In alternative examples, combustor 804 and turbine 810 may be replaced with a combustor/turbine 898 as illustrated by the dotted line. In such examples, combustor/turbine 898 may be substituted with combustor/turbine 104 (e.g., referring to FIG. 1).

After passing through turbine 810, combustion exhaust 874 forms turbine exhaust 870. Turbine exhaust 870 may have a temperature and pressure of about 50 bar and 820° C. Alternatively, a temperature and/or pressure of turbine exhaust 870 may include any of the ranges herein turbine exhaust 562 or exhaust 132 (e.g., referring to FIGS. 1 and 5). Yet alternatively, a pressure from about 20 bar to about 30 bar, about 30 bar to about 40 bar, about 40 bar to about 50 bar, about 50 bar to about 60 bar, about 60 bar to about 70 bar, or any ranges therebetween, and/or a temperature from about 650° C. to about 750° C., about 750° C. to about 850° C., about 850° C. to about 950° C., or any ranges therebetween.

As illustrated, turbine exhaust 870 is passed to SOFC 802 to provide heat thereto and forming fuel cell exhaust 868, as previously discussed. As illustrated, fuel cell exhaust 868 is then passed to recuperator 806. Recuperator 806 is a special purpose heat exchanger as shown and described for recuperators 108 and 506 (e.g., referring to FIGS. 1 and 5). Recuperator 806 causes heat to be transferred from fuel cell exhaust 868 to working fluid 873.

Recuperator exhaust 878 is formed from fuel cell exhaust 868 after fuel cell exhaust is allowed to pass through recuperator 806. As with combustion exhaust 874, recuperator exhaust 878 and fuel cell exhaust are compositionally identical. Recuperator exhaust 878 has a pressure of about 50 bar and a temperature of about 600° C. Alternatively, a pressure from about 25 bar to about 40 bar, about 40 bar to about 60 bar, about 60 bar to about 75 bar, or any ranges therebetween, and/or a temperature from about 400° C. to about 500° C., about 500° C. to about 600° C., about 600° C. to about 700° C., or any ranges therebetween. As illustrated, recuperator exhaust 878 is passed to HRSG 808 for generating steam. In one or more examples, a bypass exhaust 876 from turbine 810 is combined with recuperator exhaust 878 to form exhaust 880 prior to introduction to heat recovery steam generator 808.

In the illustrated example, water stream 882 is introduced to HRSG 808 and converted to steam 886. Steam 886 may be superheated steam. For example, steam 886 may have a pressure of about 50 bar and a temperature of about 560° C. Alternatively, from about 3 bar to about 20 bar, about 20 bar to about 40 bar, about 40 bar to about 50 bar, about 50 bar to about 60 bar, about 60 bar to about 100 bar, or any ranges therebetween. Also, from about 400° C. to about 500° C., about 500° C. to about 600° C., about 600° C. to about 700° C., or any ranges therebetween. After forming steam 886, steam 886 is passed through turbine 818 to form a turbine exhaust 894. Turbine exhaust 894 may have a pressure of about 10 bar. Alternatively, from about 3 bar to about 7 bar, about 7 bar to about 10 bar, about 10 bar to about 15 bar, or any ranges therebetween. Turbine exhaust 894, comprising water, may be introduced into condenser 816 and condensed into water stream 882 with cooling water 890. Once condensed, water stream 882 may be reintroduced to HRSG 808 via water pump 842.

As previously mentioned, recuperator exhaust 878 may be combined with bypass exhaust 876 to form exhaust 880, which is then used to provide heat for generating steam in heat recovery steam generator 808. As illustrated, exhaust 880 exits HRSG 808 and passes through heat exchanger 812, where additional heat is extracted from exhaust 880 and transferred to water stream 882 before water stream 882 is introduced to HRSG 808. After passing through water pump 842, water 882 has a temperature of about 40° C., and a pressure of about 50 bar. Exhaust 880 then proceeds to accumulator 814 as effluent 884. As discussed, effluent 884 comprises mainly carbon dioxide and water which are separated in accumulator 814. Accumulator 814 may proceed to separate carbon dioxide and water by, for example, flash distillation. Separation in accumulator 814 results in a dry $CO_2$ effluent 872 and a water effluent 892. Dry $CO_2$ effluent 872 has a pressure of about 100 bar. Alternatively, from about 50 bar to about 70 bar, about 70 bar to about 90 bar, about 90 bar to about 110 bar, or any ranges therebetween. As with previous examples, dry $CO_2$ effluent 872 comprises pipeline grade $CO_2$ to be removed, transported away and/or stored for sequestration, subsurface geological storage, utilization, or the like.

Accordingly, the present disclosure may provide methods and systems for enhancing efficiencies of various combustion cycles. The methods may include any of the various features disclosed herein, including one or more of the following statements.

Statement 1. A method comprising: introducing fuel and oxygen into a solid oxide fuel cell to generate electric current, a fuel cell oxygen effluent, and a fuel cell exhaust; combusting combustion fuel and an oxygen source in the presence of a working fluid to generate heat and a combustion exhaust, wherein the working fluid comprises carbon dioxide; heating the solid oxide fuel cell with the heat generated by combustion; generating additional electric current from the combustion exhaust with at least one turbine; separating the combustion exhaust to form a carbon dioxide enriched stream and a water enriched stream; and recycling at least a portion of the carbon dioxide enriched stream as the working fluid.

Statement 2. The method of statement 1, further comprising inducing a phase change in one or more phase change materials.

Statement 3. The method of statement 2, wherein the phase change material has a phase change temperature from about 300° C. to about 900° C.

Statement 4. The method of statements 2 or 3, wherein the inducing of the phase change material comprises heating the one or more phase change materials with heat from the combustion exhaust or a turbine exhaust.

Statement 5. The method of any of statements 1-4, further comprising generating electric potential between a heat source and a heat sink with one or more thermoelectric generators.

Statement 6. The method of statement 5, wherein the heat source comprises the combustion exhaust, the fuel cell exhaust, the solid oxide fuel cell, or a combustor.

Statement 7. The method of any of statements 1-6, further comprising removing part of the carbon dioxide enriched stream for sequestration, subsurface geological storage, or utilization.

Statement 8. The method of statement 7, wherein the portion of the carbon dioxide enriched stream is pipeline grade carbon dioxide.

Statement 9. The method of any of statements 1-8, wherein oxygen is present in the oxygen source in a concentration from about 90 wt. % to about 100 wt. % by weight of the oxygen source.

Statement 10. The method of any of statements 1-9, wherein the combustion fuel comprises hydrogen generated by hydrolysis of water.

Statement 11. The method of any of statements 1-10, wherein the oxygen is generated, at least in part, by hydrolysis of water.

Statement 12. The method of any of statements 1-11, wherein the combustion fuel comprises the fuel cell exhaust.

Statement 13. A system comprising: a solid oxide fuel cell; a combustor in fluidic and thermal communication with a solid oxide fuel cell; a turbine in energetic communication with the combustor; and a separator in fluidic communication with the combustor.

Statement 14. The system of statement 13, further comprising one or more thermoelectric generators in thermal communication with at least one system component selected from the group consisting of: the solid oxide fuel cell, the combustor, the turbine, the separator, and any combination thereof.

Statement 15. The system of statement 13 or 14, wherein the solid oxide fuel cell, the combustor, or both are in fluidic communication with an oxygen source comprising oxygen in an amount from about 90 wt. % to about 100 wt. %.

Statement 16. The system of any of statement 13-15, further comprising one or more phase change materials in thermal communication with at least one system component selected from the group consisting of: the solid oxide fuel cell, the combustor, the turbine, the separator, and any combination thereof.

Statement 17. The system of statement 16, wherein at least one of the one or more phase change materials has a phase change temperature between about 300° C. and about 900° C.

Statement 18. The system of any of statements 13-17, wherein the solid oxide fuel cell, the combustor, or both are in fluidic communication with a fuel source.

Statement 19. The system of statement 18, wherein the fuel source comprises at least one fuel selected from the group consisting of: natural gas, coal, hydrogen, propane, methane, butane, pentane, coal gas, liquefied petroleum gas, light fuel oil, heavy fuel oil, solid fuel, gaseous fuel, carbonaceous fuel, kerosene, gasoline, diesel fuel, naphtha, biodiesel, ethanol, charcoal, lignite, petroleum coke, natural gas, compressed natural gas, liquified natural gas, blast furnace gas, coke oven gas, water gas, methanol, nitromethane, jet fuel, JET-A, JP-8, biofuel, syngas, biogas, green hydrogen, pink hydrogen, blue hydrogen, and any combination thereof.

Statement 20. A system comprising: a solid oxide fuel cell; a combustor fluidically coupled to the solid oxide fuel cell; a turbine directly coupled to the combustor and in thermal communication with the solid oxide fuel cell; a recuperator energetically coupled to a turbine exhaust of the turbine; a separator fluidically coupled to the recuperator, wherein the separator is operable to separate carbon dioxide and water; a first thermoelectric generator in thermal communication with the separated carbon dioxide; a second thermoelectric generator in thermal communication with the solid oxide fuel cell; and one or more phase change material in thermal communication with an exhaust.

Although specific examples have been described above, these examples are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Various advantages of the present disclosure have been described herein, but examples may provide some, all, or none of such advantages, or may provide other advantages.

What is claimed is:

1. A method comprising:
    introducing fuel and oxygen into a solid oxide fuel cell to generate electric current, a fuel cell oxygen effluent, and a fuel cell exhaust;
    combusting combustion fuel and oxygen of an oxygen source in the presence of a working fluid to generate heat and a combustion exhaust, wherein the working fluid comprises carbon dioxide;
    heating the solid oxide fuel cell with the heat generated by combustion;
    generating additional electric current from the combustion exhaust with at least one turbine;
    separating the combustion exhaust to form a carbon dioxide enriched stream and a water enriched stream;
    recycling at least a portion of the carbon dioxide enriched stream as the working fluid; and
    generating electric potential between a heat source and a heat sink with one or more thermoelectric generators.

2. The method of claim 1, further comprising inducing a phase change in one or more phase change materials.

3. The method of claim 2, wherein the phase change material has a phase change temperature from about 300° C. to about 900° C.

4. The method of claim 2, wherein the inducing of the phase change material comprises heating the one or more phase change materials with heat from the combustion exhaust or a turbine exhaust.

5. The method of claim 1, wherein the heat source comprises the combustion exhaust, the fuel cell exhaust, the solid oxide fuel cell, or a combustor.

6. The method of claim 1, further comprising removing part of the carbon dioxide enriched stream for sequestration, subsurface geological storage, or utilization.

7. The method of claim 6, wherein the portion of the carbon dioxide enriched stream is pipeline grade carbon dioxide.

8. The method of claim 1, wherein the oxygen is present in the oxygen source in a concentration from about 90 wt. % to about 100 wt. % by weight of the oxygen source.

9. The method of claim 1, wherein the combustion fuel comprises hydrogen generated by hydrolysis of water.

10. The method of claim 1, wherein the oxygen is generated, at least in part, by hydrolysis of water.

11. The method of claim 1, wherein the combustion fuel comprises the fuel cell exhaust.

12. A system comprising:
    a solid oxide fuel cell;
    a combustor fluidically coupled to the solid oxide fuel cell;
    a turbine directly coupled to the combustor and in thermal communication with the solid oxide fuel cell;
    a recuperator energetically coupled to a turbine exhaust of the turbine;
    a separator fluidically coupled to the recuperator, wherein the separator is operable to separate carbon dioxide and water;
    a first thermoelectric generator in thermal communication with the separated carbon dioxide;
    a second thermoelectric generator in thermal communication with the solid oxide fuel cell; and
    one or more phase change material in thermal communication with an exhaust.

13. The system of claim 12, wherein at least one of the thermoelectric generators is in thermal communication with at least one system component selected from the group consisting of the solid oxide fuel cell, the combustor, the turbine, the separator, and any combination thereof.

14. The system of claim 12, wherein the solid oxide fuel cell, the combustor, or both are in fluidic communication with an oxygen source comprising oxygen in an amount from about 90 wt. % to about 100 wt. %.

15. The system of claim 12, wherein at least one phase change material is in thermal communication with at least one system component selected from the group consisting of the solid oxide fuel cell, the combustor, the turbine, the separator, and any combination thereof.

16. The system of claim 15, wherein at least one of the one or more phase change materials has a phase change temperature between about 300° C. and about 900° C.

17. The system of claim 12, wherein the solid oxide fuel cell, the combustor, or both are in fluidic communication with a fuel source.

18. The system of claim 17, wherein the fuel source comprises at least one fuel selected from the group consisting of natural gas, coal, hydrogen, propane, methane, butane, pentane, coal gas, liquefied petroleum gas, light fuel oil, heavy fuel oil, solid fuel, gaseous fuel, carbonaceous fuel, kerosene, gasoline, diesel fuel, naphtha, biodiesel, ethanol, charcoal, lignite, petroleum coke, natural gas, compressed natural gas, liquified natural gas, blast furnace gas, coke oven gas, water gas, methanol, nitromethane, jet fuel, JET-A, JP-8, biofuel, syngas, biogas, green hydrogen, pink hydrogen, blue hydrogen, and any combination thereof.

\* \* \* \* \*